United States Patent
Chang et al.

(10) Patent No.: US 10,970,450 B2
(45) Date of Patent: Apr. 6, 2021

(54) CELL STRUCTURES AND SEMICONDUCTOR DEVICES HAVING SAME

(71) Applicant: TAIWAN SEMICONDUCTOR MANUFACTURING COMPANY, LTD., Hsinchu (TW)

(72) Inventors: Fong-Yuan Chang, Hsinchu (TW); Jyun-Hao Chang, Kaoshiung (TW); Sheng-Hsiung Chen, Zhubei (TW); Ho Che Yu, Zhubei (TW); Lee-Chung Lu, Taipei (TW); Ni-Wan Fan, Taoyuan (TW); Po-Hsiang Huang, Tainan (TW); Chi-Yu Lu, New Taipei (TW); Jeo-Yen Lee, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 281 days.

(21) Appl. No.: 15/782,232

(22) Filed: Oct. 12, 2017

(65) Prior Publication Data
US 2018/0150592 A1    May 31, 2018

Related U.S. Application Data

(60) Provisional application No. 62/427,802, filed on Nov. 29, 2016.

(51) Int. Cl.
*G06F 30/392* (2020.01)
*H01L 27/118* (2006.01)
(Continued)

(52) U.S. Cl.
CPC ............ *G06F 30/392* (2020.01); *G06F 30/39* (2020.01); *G06F 30/398* (2020.01);
(Continued)

(58) Field of Classification Search
CPC ..................................................... G06F 30/392
(Continued)

(56) References Cited

U.S. PATENT DOCUMENTS

| 8,987,828 B2 | 3/2015 | Moroz et al. |
| 2012/0278777 A1 | 11/2012 | Lin et al. |

(Continued)

FOREIGN PATENT DOCUMENTS

| CN | 102779201 | 11/2012 |
| CN | 104471714 | 3/2015 |

(Continued)

OTHER PUBLICATIONS

Notice of Allowance dated Jul. 17, 2019 and English translation from corresponding application No. KR 10-2017-0160745.
(Continued)

*Primary Examiner* — Eric D Lee
(74) *Attorney, Agent, or Firm* — Hauptman Ham, LLP

(57) ABSTRACT

A semiconductor device comprising active areas and a structure. The active areas are formed as predetermined shapes on a substrate and arranged relative to a grid having first and second tracks which are substantially parallel to corresponding orthogonal first and second directions; The active areas are organized into instances of a first row having a first conductivity and a second row having a second conductivity. Each instance of the first row and of the second row includes a corresponding first and second number predetermined number of the first tracks. The structure has at least two contiguous rows including: at least one instance of the first row; and at least one instance of the second row. In the first direction, the instance(s) of the first row have a first width and the instance(s) of the second row a second width substantially different than the first width.

20 Claims, 16 Drawing Sheets

(51) Int. Cl.
*G06F 30/398* (2020.01)
*G06F 30/39* (2020.01)
*H01L 23/538* (2006.01)
*H01L 27/02* (2006.01)

(52) U.S. Cl.
CPC ...... *H01L 23/5386* (2013.01); *H01L 27/0207* (2013.01); *H01L 27/11807* (2013.01); *H01L 2027/11811* (2013.01)

(58) Field of Classification Search
USPC ........................................................ 716/119
See application file for complete search history.

(56) References Cited

U.S. PATENT DOCUMENTS

2013/0334610 A1* 12/2013 Moroz ............ H01L 21/823821
257/369
2014/0325466 A1* 10/2014 Ke ...................... G06F 17/5072
716/119
2015/0041924 A1 2/2015 Moroz
2016/0055285 A1 2/2016 Baek et al.
2017/0323894 A1 11/2017 Yeh et al.

FOREIGN PATENT DOCUMENTS

| | | |
|---|---|---|
| CN | 107346770 | 11/2017 |
| KR | 20140036446 | 3/2014 |
| KR | 20150031249 | 3/2015 |
| KR | 20160023538 | 3/2016 |
| TW | 201740541 | 11/2017 |

OTHER PUBLICATIONS

Office Action dated Sep. 26, 2018 from corresponding application No. TW 106141624.
Office Action dated Dec. 10, 2018 from corresponding application No. KR 10-2017-0160745.
Office Action dated Mar. 3, 2020 from corresponding application No. CN 201711206781.X.

\* cited by examiner

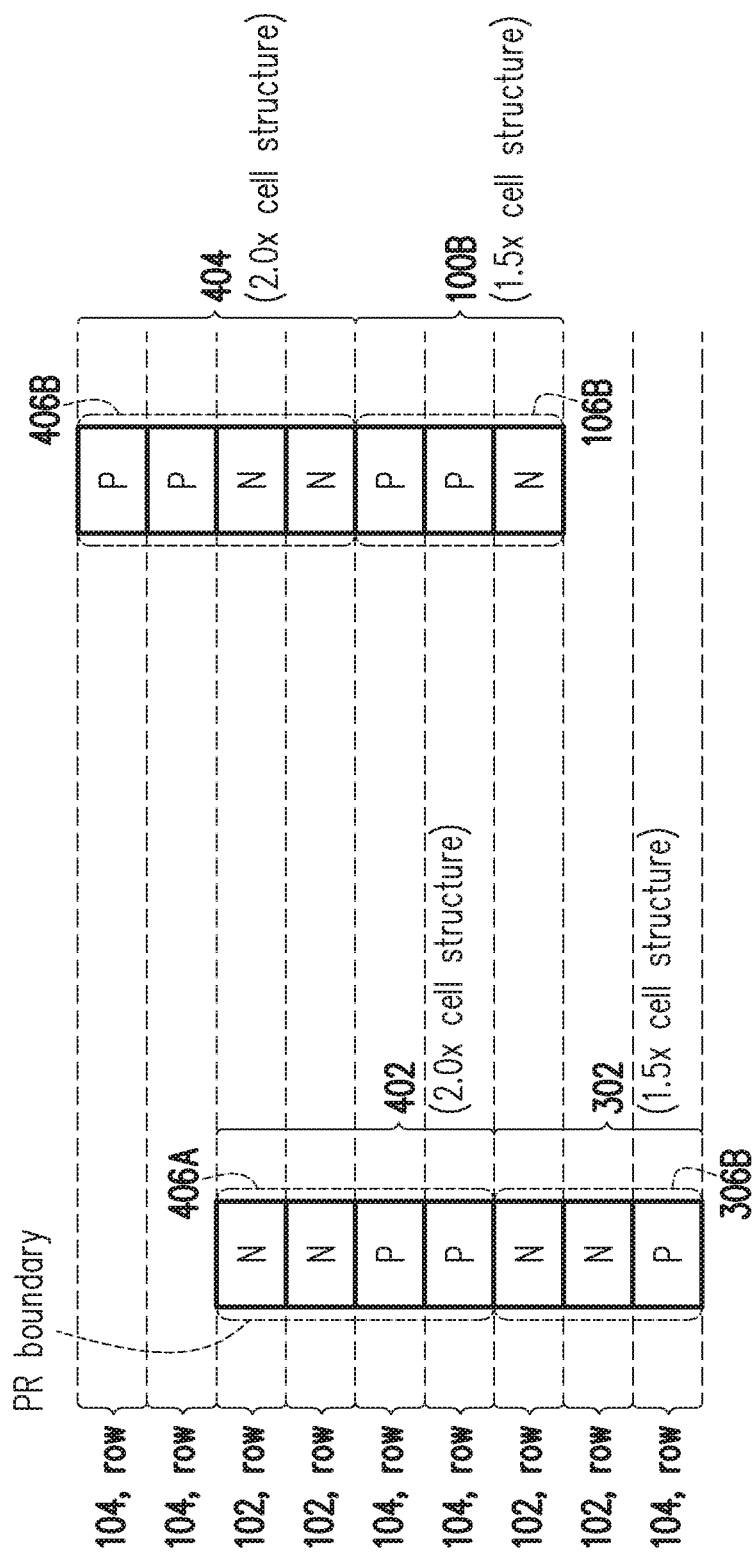

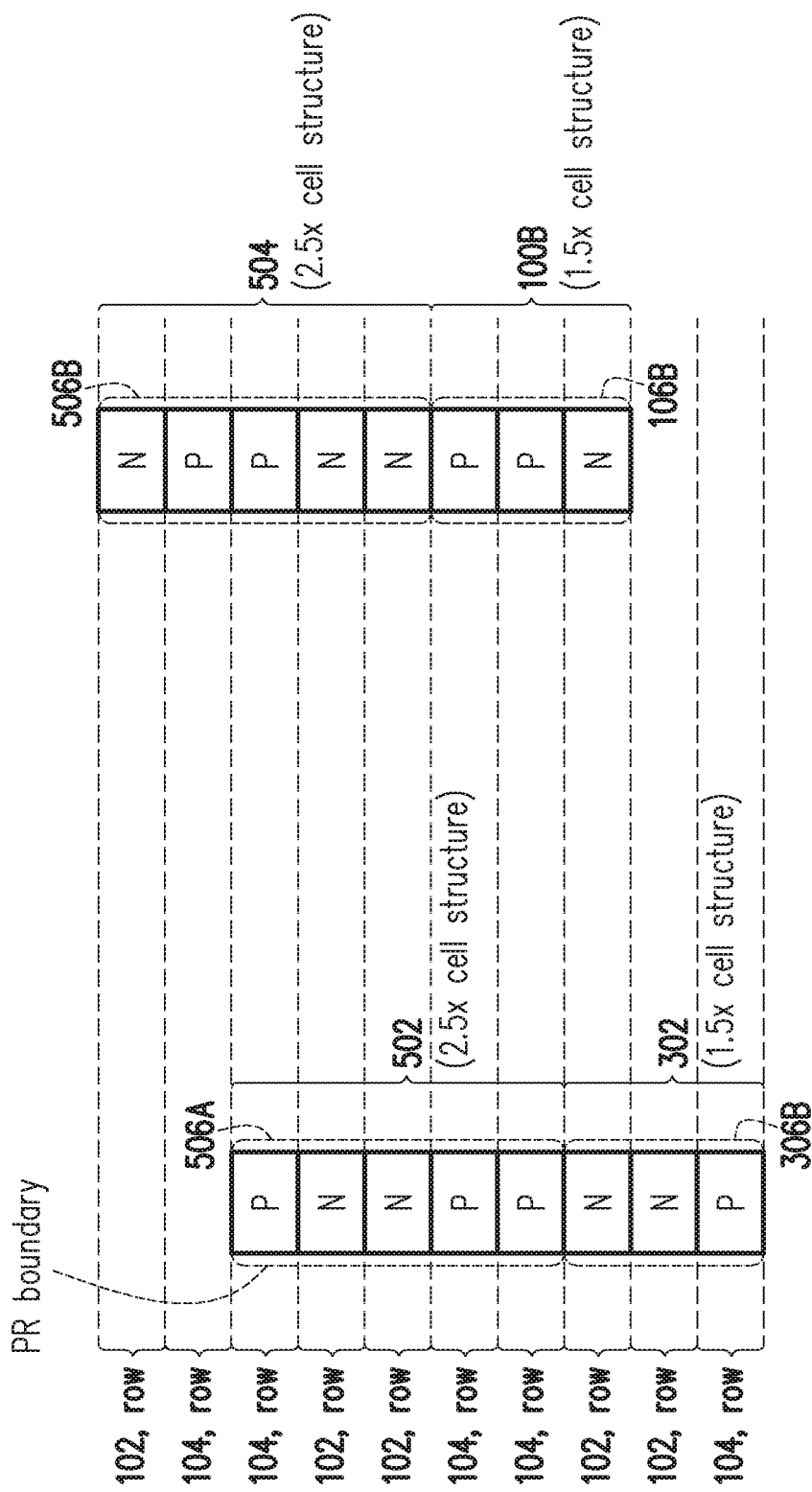

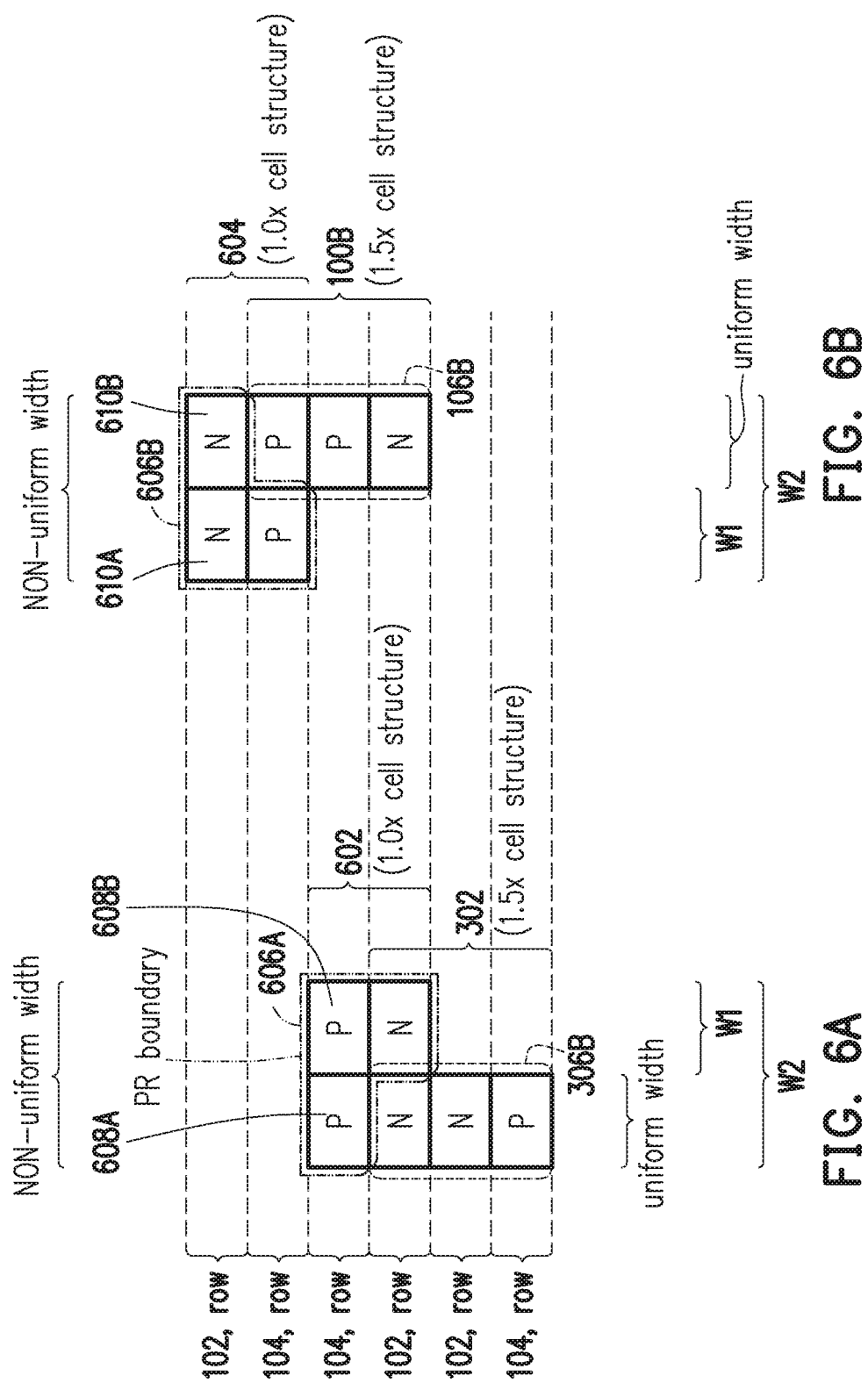

CELL STRUCTURES AND SEMICONDUCTOR DEVICES HAVING SAME

BACKGROUND

A semiconductor device, one or more of which are included in an integrated circuit (IC), includes a number of electronic devices. One way in which to represent a semiconductor device is with a plan view diagram referred to as a layout diagram (hereinafter, layout). A layout is hierarchical and is decomposed into modules which carry out higher-level functions as indicated by the semiconductor device's design specifications.

For a given SCD project, a custom cell is designed with an arrangement that is specific to the given SCD project in order to provide (in operation) a higher-level logic function that is specific to the SCD project. By contrast, a library of standard cells is designed with no particular project in mind and includes standard cells which provide (in operation) common, lower-level logic functions. In terms of a footprint within a layout (from the perspective of a plan view), custom cells are larger (typically much larger) than standard cells. Moreover, for a given library, all of the standard cells have at least one dimension which is the same size (typically, the size being a multiple of a library-specific fixed dimension) in order to facilitate placement of the standard cells into a layout. Typically, the direction of the fixed dimension is parallel to the vertical direction or Y-axis such that the fixed dimension is referred to as the height of the standard cell. As such, standard cells are described as being predefined with respect to a given SCD project. Custom cells may or may not have at least one dimension that is the same size as the corresponding dimension of the standard cells.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

FIGS. 4A and 4B are block diagrams of corresponding uniform-width 2.0× cell structures, in accordance with some embodiments.

FIGS. 5A and 5B are block diagrams of corresponding uniform-width 2.5× cell structures, in accordance with some embodiments.

FIGS. 6A and 6B are block diagrams of corresponding additional non-uniform-width, 1.0× cell structures, in accordance with some embodiments.

DETAILED DESCRIPTION

Figure 1A:
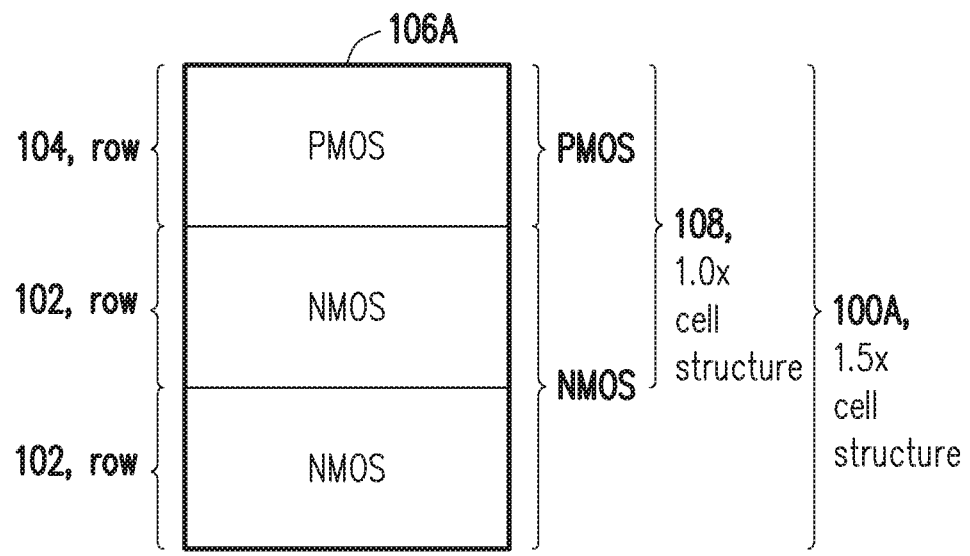
FIGS. 1A and 1B are block diagrams of corresponding uniform-width, 1.5× cell structures, in accordance with some embodiments.

The following disclosure provides many different embodiments, or examples, for implementing different features of the provided subject matter. Specific examples of components, materials, values, steps, operations, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein in phrases such as "substantially parallel," "substantially the same," "substantially twice as," "substantially collinear," or the like, the adverb "substantially" should be understood as broadening the phrase of which "substantially" is a part so that the phrase denotes a scope which is inclusive of variations which result from manufacturing process-tolerances, e.g., the phrase "substantially parallel" includes not only parallel per se but also variances from parallel which result from manufacturing process-tolerances. Similarly, the phrase "substantially different" should be understood as describing differences which are greater in magnitude, at the least, than mere variations which result from manufacturing process-tolerances. In some embodiments, the term "standard cell structure" refers to a standardized building block included in a library of various standard cell structures. In some embodiments, various standard cell structures are selected from a library thereof and are used as components in a layout diagram representing a circuit.

In some embodiments, the term 'even sigma' (even Σ), used in reference to a cell structure, indicates that a total number of contiguous rows in the cell structure is even. In some embodiments, the term 'odd sigma' (odd Σ), used in reference to a cell structure, indicates that the total number of contiguous rows in the cell structure is odd. In some embodiments, even Σ indicates that the total number of rows (contiguous or not) in the cell structure is even. In some embodiments, odd sigma indicates that the total number of rows (contiguous or not) in the cell structure is odd.

The term, 'uniform-width,' used in reference to a cell structure, indicates that the width of the cell structure is uniform along the height of the cell structure. The term, 'NON-uniform-width, used in reference to a cell structure, indicates that the width of the cell structure is not uniform along the height of the cell structure.

A 1.0× height cell structure includes one row configured for PMOS technology and one row configured for NMOS technology, where the sum of the heights (in the vertical direction) of the one PMOS row and the one NMOS row represents a unit height referred to herein as '1.0×.' The 1.0× height cell structure is an example of an even cell structure because there is one row configured for PMOS technology and one row configured for NMOS technology. To improve performance while complying with a design goal of preserving parity in the number of PMOS rows and NMOS rows, the 1.0× height cell structure is expanded to form a 2.0× height cell structure which includes two PMOS rows and two NMOS rows. The 2.0× height cell structure is another example of an even Σ cell structure. The 2.0× height cell structure improves performance (e.g., propagation delay) by about 100% but comes at the cost of an increase by about 100% in pin capacitance, relative to the 1.0× cell structure. According to some embodiments, there is provided a 1.5× height cell structure which abandons parity in the number of PMOS rows and NMOS rows and so includes: two instances of a first row configured for one of PMOS or NMOS finFET technology; and one instance of a second row configured for the other of the PMOS or NMOS finFET technology; wherein each of the PMOS and NMOS finFET technology includes fins. The 1.5× height cell structure is an example of odd Σ cell structure because there are two instances of a first row configured for a first conductivity (PMOS or NMOS) and one instance of a second row configured for a second conductivity (correspondingly NMOS or PMOS) According to some embodiments, the 1.5× height, odd Σ cell structure improves performance by about 50% (relative to the 1.0× cell height, an even Σ cell structure) due to reduced propagation delay. According to some embodiments, the odd Σ cell structure also has uniform width. According to some embodiments, the odd Σ cell structure also has non-uniform width.

According to some embodiments, uniform-width of a standard cell structure is discarded as a design rule so as to provide a non-uniform-width cell structure which includes: at least one instance of a first row configured for one of PMOS or NMOS technology; and at least one instance of a second row configured for the other of the PMOS or NMOS technology. In some embodiments, each of the at least one instance of the first row in the non-uniform-width cell structure has a first width in a first direction, and each of the at least one instance of the second row in the non-uniform-width cell structure has a second width in the first direction, the second width being substantially twice as large as the first width. According to some embodiments, the non-uniform-width cell structure is also an even cell structure. According to some embodiments, the non-uniform-width cell structure is also an odd Σ cell structure.

Figure 1B:
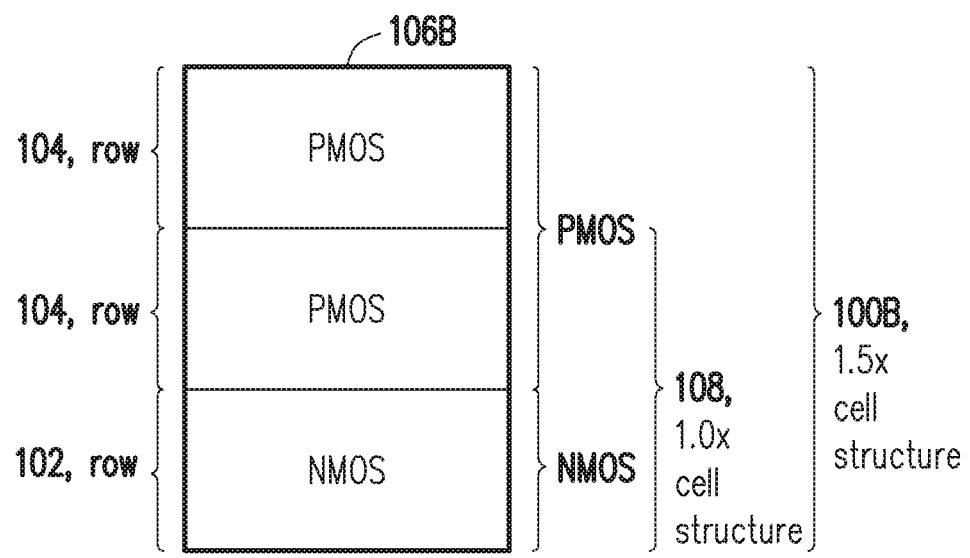

FIGS. 1A and 1B are block diagrams of corresponding uniform-width, 1.5× cell structures 100A and 100B, in accordance with some embodiments. In some embodiments, uniform-width, 1.5× cell structures 100A and 100B are used as standard cell structures in a library of standard cell structures.

In FIG. 1A, 1.5× cell structure 100A includes: two instances of a row 102 configured for NMOS finFET technology; and one instance of a row 104 configured for PMOS finFET technology. In 1.5× cell structure 100A, the two instances of NMOS finFET row 102 are contiguous in the vertical direction. Also, one of the two instances of NMOS finFET row 102 is contiguous with the one instance of a PMOS row 104 in the vertical direction. The two instances of NMOS finFET row 102 and the one instance of PMOS finFET row 104 in 1.5× cell structure 100A have a uniform width in the horizontal direction. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

In some embodiments, uniform-width, 1.5× cell structure 100A includes a uniform-width, 1.0× cell structure 108, the latter including: one instance of NMOS finFET row 102; and one instance of a PMOS finFET row 104. Relative to 1.0× cell structure 108, 1.5× cell structure 100A includes 50% more rows because 1.5× cell structure 100A includes an extra instance of NMOS finFET row 102. Hence, a prefix of "1.5" is added to cell structure 100A, resulting in the term 1.5× cell structure 100A.

In terms of using 1.5× cell structure 100A in an automated place-and-route ("APR") system, a perimeter of 1.5× cell structure 100A represents a place and route ("PR") boundary 106A. In some embodiments, in the context of the APR system, overlap between two instances of 1.5× cell structure 100A is not permitted, however a portion of a first instance of 1.5× cell structure 100A is permitted to be contiguous with a portion of PR boundary 106A of a second instance of 1.5× cell structure 100A. Accordingly, PR boundary 106A is a boundary in the sense of preventing overlap of two instances of 1.5× cell structure 100A. In FIG. 1A, PR boundary 106A is a rectangle, with a long axis of the rectangle being substantially parallel to the vertical direction.

The 1.5× cell structure 100B of FIG. 1B is similar to 1.5× cell structure 100A of FIG. 1A. For the sake of brevity, the discussion of 1.5× cell structure 100B will focus on differences with respect to 1.5× cell structure 100A.

In FIG. 1B, 1.5× cell structure 100B includes: one instance of NMOS finFET row 102; and two instances of PMOS finFET row 104. In 1.5× cell structure 100B, the two instances of PMOS finFET row 104 are contiguous in the vertical direction. Also, one of the two instances of PMOS finFET row 104 is contiguous with the one instance of a NMOS row 102 in the vertical direction. The one instance of NMOS finFET row 102 and the two instances of PMOS finFET row 104 in 1.5× cell structure 100B have a uniform width in the horizontal direction. It is to be recognized that 1.5× cell structure 100B includes uniform-width, 1.0× cell structure 108. A perimeter of 1.5× cell structure 100B represents a PR boundary 106B.

In FIGS. 1A-1B, a stacking direction is parallel to the vertical direction. In some embodiments, rotation of uniform-width, 1.5× cell structures 100A and/or 100B is contemplated resulting in stacking directions other than the vertical direction.

Figure 1C:
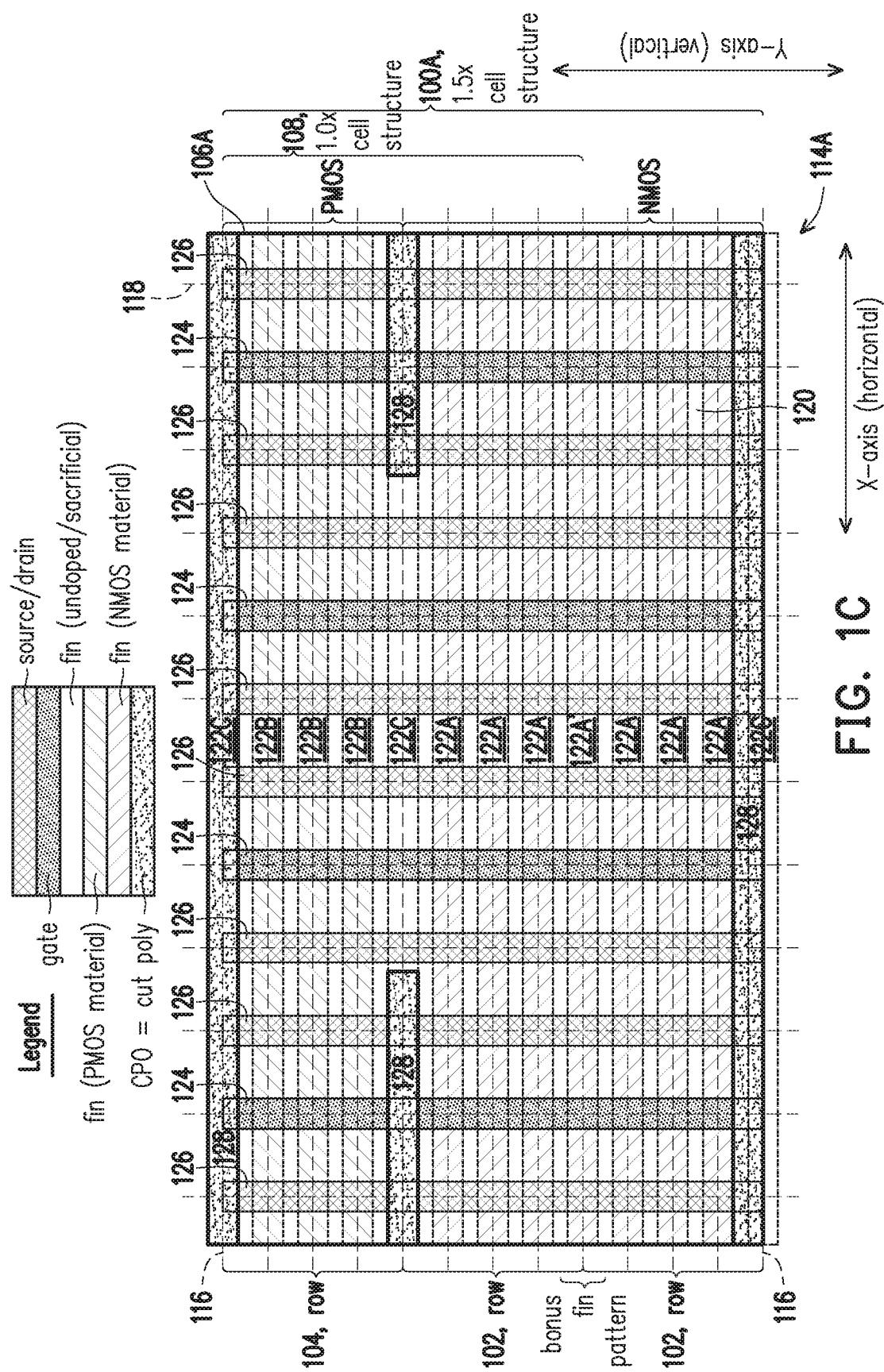
FIGS. 1C and 1D are layout diagrams corresponding to the uniform-width, 1.5× cell structures of FIGS. 1A and 1B, in accordance with some embodiments.
Figure 1D:
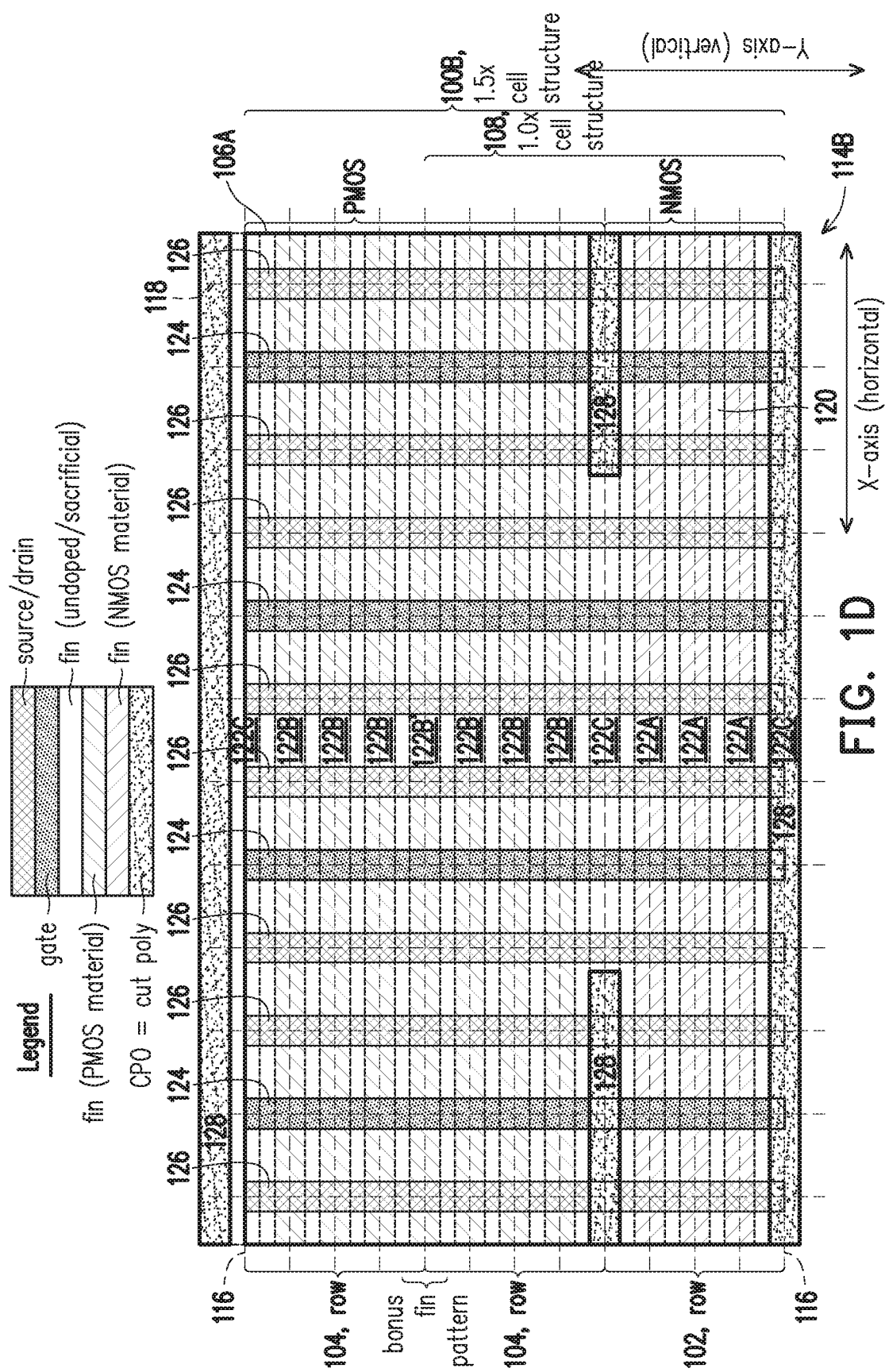

FIGS. 1C and 1D are layout diagrams 114A and 114B corresponding to uniform-width, 1.5× cell structures 100A and 100B, in accordance with some embodiments.

In FIG. 1C, the two instances of row 102 and the one instance of row 104 of 1.5× cell structure 100A each includes a predetermined number of the imaginary first reference lines/tracks 116 of an imaginary grid, where first reference lines/tracks 116 lie parallel to the horizontal direction. The imaginary grid further includes imaginary second reference lines/tracks 118 lying parallel to the vertical direction, second reference lines/tracks 118 being perpendicular to first reference lines/tracks 116. In FIG. 1C, as an example, each instance of row 102 and of row 104 includes five instances of first reference lines/tracks 116. More particularly, in the example of FIG. 1C, a central portion of each instance of row 102 and of row 104 covers three instances of first reference lines/tracks 116, while an upper and lower border (relative to the vertical direction) of each instance of row 102 and of row 104 is substantially collinear with a corresponding one instance of first reference lines/tracks 116. In some embodiments, other numbers of first reference lines/tracks 116 are included in each instance of row 102 and of row 104.

In layout diagram 114A, instances of fin patterns 122A, 122B and 122C are arranged over a substrate 120. More particularly, instances of fin patterns 122A, 122B and 122C are arranged substantially collinearly with respect to corresponding ones of the parallel imaginary first reference lines/tracks 116, and thus are substantially parallel to the horizontal direction. In FIG. 1C, as an example, a central portion of each instance of row 102 and of row 104 covers three instances of fin patterns 122A or 122B, while an upper and lower border (relative to the vertical direction) of each instance of row 102 and of row 104 overlaps half of an instance of fin pattern 122C. As such, each instance of row 102 and of row 104 includes four instances (4=3+2*0.5) of fin patterns 122A, 122B and/or 122C. In some embodiments, other numbers of instances of fin patterns 122A, 122B and/or 122C are included in each instance of row 102 and of row 104.

In FIG. 1C, fins resulting from instances of fin pattern 122A will be configured for NMOS technology. Fins resulting from instances of fin pattern 122B will be configured for PMOS technology. In some embodiments, fins resulting from instances of fin pattern 122C are not included as functional components in semiconductor devices, as explained below. Accordingly, in some embodiments, fins resulting from instances of fin pattern 122C are not configured for either NMOS or PMOS technology. In some embodiments, fins resulting from instances of fin pattern 122C are not doped for a particular conductivity. Additional details regarding the structure and manufacture of CMOS finFET technology are disclosed in commonly assigned U.S. Pat. No. 8,786,019, granted Jul. 22, 2014, the entirety of which is hereby incorporated by reference.

Instances of fin pattern 122C arise under two circumstances. In a first one of the two circumstances, an instance of NMOS row 102 is contiguous in the vertical direction with an instance of PMOS row 104 such that the instance of NMOS row 102 overlaps a first half of an instance of fin pattern 122C and the instance of PMOS row 104 overlaps a second half of the instance of fin pattern 122C. In the first circumstance, the instance of fin pattern 122C represents the border between an NMOS region and a PMOS region which is internal to 1.5× cell structure 100A. A fin resulting from such an instance of fin pattern 122C is not included as a functional component in a semiconductor device of 1.5× cell structure 100A.

In a second one of the two circumstances, a first instance of 1.5× cell structure 100A is arranged to be contiguous in the vertical direction with another cell structure, e.g., a second instance of 1.5× cell structure 100A. As such, a portion of PR boundary of 106A of the first instance of 1.5× cell structure 100A overlaps a first half of an instance of fin pattern 122C and a portion of PR boundary of 106A of the second instance of 1.5× cell structure 100A overlaps a second half of the instance of fin pattern 122C. A fin resulting from such an instance of fin pattern 122C is not included as a functional component in a semiconductor device in either of the first instance of 1.5× cell structure 100A or the second instance of 1.5× cell structure 100A.

In layout diagram 114I, instances of gate patterns 124 and source/drain patterns 126 are arranged over instances of fin patterns 122A, 122B and 122C. In some embodiments, one or more layers of insulation material (not shown) are disposed on substrate 120 and on and between instances of fin patterns 122A, 122B and 122C. More particularly, instances of gate patterns 124 and source/drain patterns 126 are arranged substantially collinearly with respect to corresponding ones of second reference lines/tracks 118, and thus are substantially parallel to the vertical direction. In FIG. 1C, relative to the horizontal direction, each instance of gate pattern 124 has an instance of source/drain pattern 126 as the nearest neighbor. In FIG. 1C, relative to the horizontal direction, no instance of gate pattern 124 overlaps another instance of gate pattern 124 or an instance of source/drain pattern 126. Similarly, no instance of source/drain pattern 126 overlaps another instance of source/drain pattern 126 or an instance of gate pattern 124. In some embodiments, other numbers of gate patterns 124 are included within 1.5× cell structure 100A. In some embodiments, other numbers of source/drain patterns 126 are included within 1.5× cell structure 100A.

Depending upon the semiconductor device or devices which will result from an instance of 1.5× cell structure 100A, one or more portions of one or more of gate patterns 124 eventually will be removed/cut. An instance of a cut pattern 128 is used to indicate one or more portions of corresponding one or more gate patterns 124 which eventually will be removed/cut. For purposes of discussion, FIG. 1C has four instances of cut pattern 128. A first instance of cut pattern 128 is located at the top border of 1.5× cell structure 100A. A second instance of cut pattern 128 is located at the bottom border of 1.5× cell structure 100A. Third and fourth instances of cut pattern 128 are located over the instance of fin pattern 122C which represents the border between the one instance of PMOS row 104 in 1.5× cell structure 100A and one of the two instances of NMOS row 102 in 1.5× cell structure 100A. The third and fourth instances of cut pattern 128 will result in corresponding portions of the leftmost and rightmost instances of gate pattern 124 in 1.5× cell structure 100A being removed/cut.

In 1.5× cell structure 100A of FIG. 1C, at the border between the two instances of NMOS row 102, in some embodiments there is not an instance of fin pattern 122C because there are instances of fin pattern 122A on either side of the border. Again, fins resulting from instances of fin pattern 122A will be configured for NMOS technology. Accordingly, an instance 122A' of fin pattern 122A is provided at the border between the two instances of NMOS row 102 instead of an instance of fin pattern 122C. Instance 122A' of fin pattern 122A represents a bonus/extra fin relative to two discrete instances of NMOS row 102, which is a benefit of 1.5× cell structure 100A.

Layout diagram 114B in FIG. 1D is similar to layout diagram 114A of FIG. 1C. For the sake of brevity, the discussion of layout diagram 114D will focus on differences with respect to layout diagram 114A.

In FIG. 1D, the one instance of row 102 of 1.5× cell structure 100B includes fin patterns 122A, and the two instances of row 104 of 1.5× cell structure 100B each includes fin patterns 122B. In FIG. 1D, fins resulting from instances of fin pattern 122A will be configured for NMOS technology and fins resulting from instances of fin pattern 122B will be configured for PMOS technology.

For purposes of discussion, FIG. 1D has four instances of cut pattern 128. A first instance of cut pattern 128 is located at the top border of 1.5× cell structure 100B. A second instance of cut pattern 128 is located at the bottom border of 1.5× cell structure 100B. Third and fourth instances of cut pattern 128 are located over the instance of fin pattern 122O which represents the border between one of the two instances of PMOS row 104 in 1.5× cell structure 100B and the one instance of NMOS row 102 in 1.5× cell structure 100B. The third and fourth instances of cut pattern 128 will result in the corresponding portions of the leftmost and rightmost instances of gate pattern 124 in 1.5× cell structure 100B being removed/cut.

In 1.5× cell structure 100B of FIG. 1D, at the border between the two instances of PMOS row 104, in some embodiments there is not an instance of fin pattern 122C because there are instances of fin pattern 122B on either side of the border. Again, fins resulting from instances of fin pattern 122B will be configured for PMOS technology. Accordingly, an instance 122B' of fin pattern 122B is provided at the border between the two instances of PMOS row 104 instead of an instance of fin pattern 122O. Instance 122B' of fin pattern 122B represents a bonus/extra fin relative to two discrete instances of PMOS row 104, which is a benefit of 1.5× cell structure 100B.

Figure 2A:
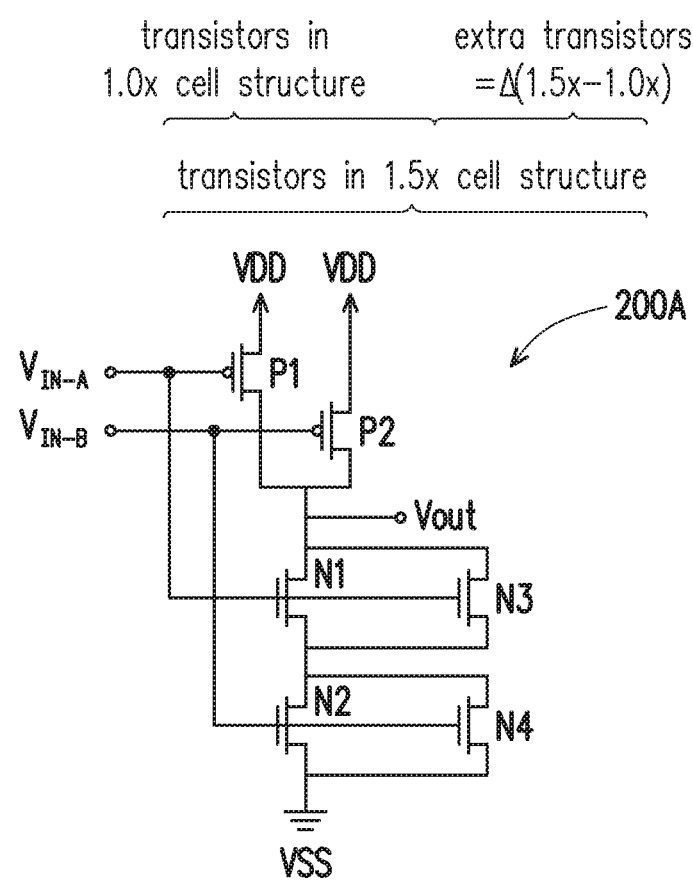
FIGS. 2A and 2B are diagrams of circuits implemented using corresponding uniform-width, 1.5× cell structures of FIGS. 1A and 1B, in accordance with some embodiments.
Figure 2B:
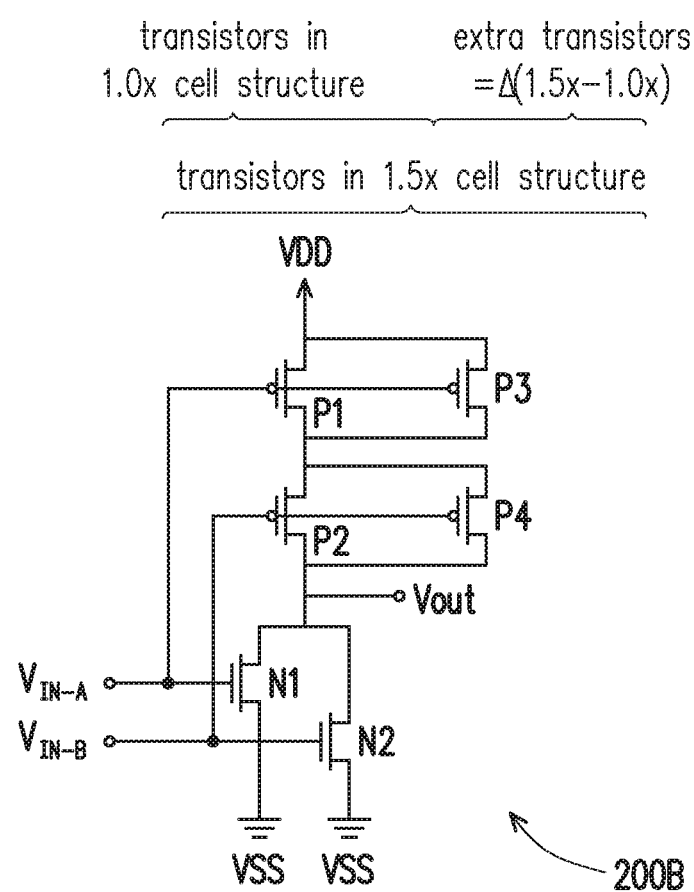

FIGS. 2A and 2B are diagrams of circuits 200A and 200B which can be implemented using corresponding uniform-width, 1.5× cell structures 100A and 100B of FIGS. 1A and 1B, in accordance with some embodiments.

In FIG. 2A, circuit 200A is an example of a two-input NAND gate. In some embodiments, circuit 200A is a different implementation of a two-input NAND gate. In some embodiments, circuit 200A is a circuit other than a two-input NAND gate.

Circuit 200A includes PMOS transistors P1 and P2, and NMOS transistors N1, N2, N3 and N4. PMOS transistors P1 and P2 are connected in parallel. NMOS transistors N1 and N2 are connected in series. NMOS transistors N3 and N4 are connected in series. NMOS transistors N1 and N3 are connected in parallel. The gates of NMOS transistors N1 and N3 are connected to input node $V_{IN-A}$ on which a first input voltage is available, NMOS transistors N2 and N4 are connected in parallel. The gates of NMOS transistors N2 and N4 are connected to input node $V_{IN-B}$ on which a second input voltage is available. The sources of PMOS transistors P1 and P2 are connected to a system voltage VDD. The drains of PMOS transistors P1 and P2 are connected together at a node Vout on which an output voltage is available. The gates of PMOS transistors P1 and P2 are connected to corresponding input nodes $V_{IN-A}$ and $V_{IN-B}$. The drains of NMOS transistors N1 and N3 are connected to node Vout. The sources of NMOS transistors N1 and N3 are connected together. The drains of NMOS transistors N2 and N4 are connected together and are connected to the sources of transistors N1 and N3. The sources of NMOS transistors N2 and N4 are connected to a system ground voltage VSS. The gates of NMOS transistors N1 and N3 are connected to input node $V_{IN-A}$. The gates of NMOS transistors N2 and N4 are connected to input node $V_{IN-B}$.

In circuit 200A, PMOS transistors P1 and P2 and NMOS transistors N1 and N2 represent transistors in a circuit which can be implemented with uniform-width, 1.0× cell structure 108. NMOS transistors N3 and N4 represent the additional transistors in circuit 200A which can be implemented by 1.5× cell structure 100A relative to the corresponding circuit which can be implemented by uniform-width, 1.0× cell structure 108. Accordingly, relative to the circuit which can be implemented by 1.0× cell structure 108, NMOS transistors N3 and N4 help circuit 200A improve performance (e.g., propagation delay between node Vout and VSS) by about 50%, relative to the uniform-width, 1.0× cell structure.

In FIG. 2B, circuit 200B is an example of a two-input NOR gate. In some embodiments, circuit 200B is a different implementation of a two-input NOR gate. In some embodiments, circuit 200B is circuit other than a two-input NOR gate.

Circuit 200B includes PMOS transistors P1, P2, P3 and P4, and NMOS transistors N1 and N2. NMOS transistors N1 and N2 are connected in parallel. PMOS transistors P1 and P2 are connected in series. PMOS transistors P3 and P4 are connected in series. PMOS transistors P1 and P3 are connected in parallel. The gates of PMOS transistors P1 and P3 are connected to input node $V_{IN-A}$. on which a first input voltage is available. PMOS transistors P2 and P4 are connected in parallel. The gates of PMOS transistors P2 and P4 are connected to input node $V_{IN-B}$. on which a second input voltage is available. The sources of PMOS transistors P1 and P3 are connected to system voltage VDD. The drains of PMOS transistors P1 and P3 are connected together. The sources of PMOS transistors P2 and P4 are connected together and also are connected to the drains of PMOS transistors P1 and P3. The drains of PMOS transistors P2 and P4 are connected together at a node Vout on which an output voltage is available. The drains of NMOS transistors N1 and N2 are connected to node Vout. The sources of NMOS transistors N1 and N2 are connected to a system ground voltage VSS. The gates of NMOS transistors N1 and N2 are connected to corresponding input nodes $V_{IN-A}$ and $V_{IN-B}$.

In circuit 200B, PMOS transistors P1 and P2 and NMOS transistors N1 and N2 represent transistors in a circuit which can be implemented with 1.0× cell structure 108. PMOS transistors P3 and P4 represent the additional transistors in circuit 200B which can be implemented by 1.5× cell structure 100B relative to the corresponding circuit which can be implemented by 1.0× cell structure 108. Accordingly, relative to the circuit which can be implemented by 1.0× cell structure 108, PMOS transistors P3 and P4 help circuit 200B improve performance (e.g., propagation delay between VDD and node Vout) by about 50%, relative to the uniform-width, 1.0× cell structure.

Figures 3A, 3B:
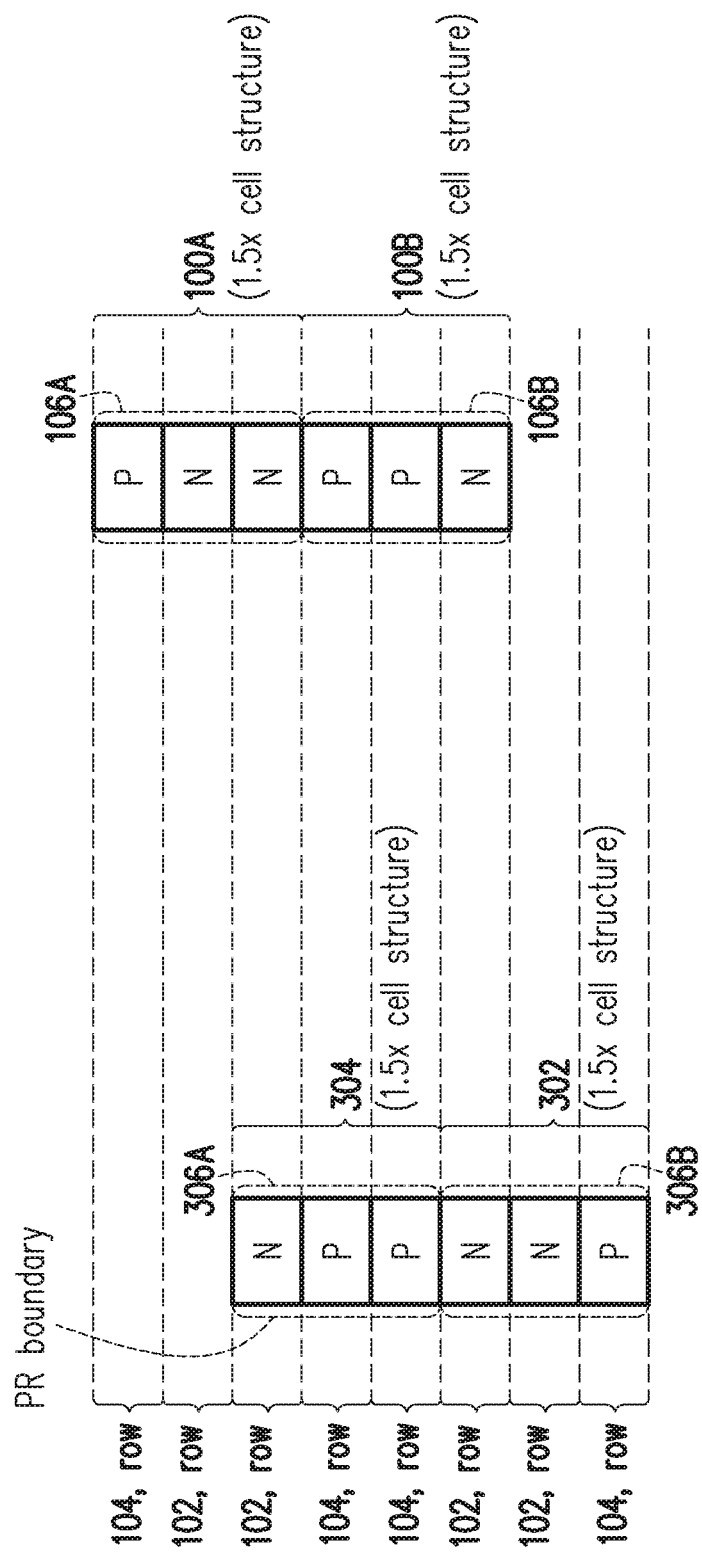
FIGS. 3A and 3B are block diagrams of corresponding additional uniform-width, 1.5× cell structures, in accordance with some embodiments.

FIGS. 3A and 3B are block diagrams of corresponding additional uniform-width, 1.5× cell structures 302 and 304, in accordance with some embodiments. More particularly, FIGS. 3A and 3B are block diagrams of corresponding stacked pairings of uniform-width, 1.5× cell structures, in accordance with some embodiments. In some embodiments, uniform-width, 1.5× cell structures 302 and 304 are used as standard cell structures in a library of standard cell structures.

In FIG. 3A, an instance of 1.5× cell structure 302 has an instance of 1.5× cell structure 304 stacked thereon relative to the vertical direction. The 1.5× cell structure 302 is a version of 1.5× cell structure 100A such that 1.5× cell structure 302 includes: two instances of NMOS row 102; and one instance of PMOS row 104. In the vertical direction, from top to bottom, 1.5× cell structure 302 has an N-N-P arrangement. The 1.5× cell structure 304 is a version of 1.5× cell structure 100B such that 1.5× cell structure 304 includes: one instance of NMOS row 102; and two instances of PMOS row 104. In the vertical direction, from top to bottom, 1.5× cell structure 304 has an N-P-P arrangement.

In FIG. 3A, 1.5× cell structure 302 has a PR boundary 306B and 1.5× cell structure 304 has a PR boundary 306A. Each of PR boundary 306A and PR boundary 306B is a rectangle, with a long axis of the rectangle being substantially parallel to the vertical direction. When 1.5× cell structure 304 is stacked on 1.5× cell structure 302, one of the two instances of PMOS row 104 in 1.5× cell structure 304 is contiguous in the vertical direction with the one of the two instances of NMOS row 102 in 1.5× cell structure 302. In some embodiments, an instance of 1.5× cell structure 302 is stacked on an instance of 1.5× cell structure 304 relative to the vertical direction.

In FIG. 3B, an instance of uniform-width, 1.5× cell structure 100A is stacked on an instance of uniform-width, 1.5× cell structure 100B relative to the vertical direction. When 1.5× cell structure 100A is stacked on 1.5× cell structure 100B, one of the two instances of NMOS row 102 in 1.5× cell structure 100A is contiguous in the vertical direction with the one of the two instances of PMOS row 104 in 1.5× cell structure 100B. In some embodiments, an instance of 1.5× cell structure 100B is stacked on an instance of 1.5× cell structure 100A relative to the vertical direction.

Relative to the vertical direction: 1.5× cell structure 302 of FIG. 3A is mirror-symmetric with respect to 1.5× cell structure 100A of FIG. 3B; and 1.5× cell structure 304 of FIG. 3A is mirror-symmetric with respect to 1.5× cell structure 100B of FIG. 3B. In some embodiments, other stacked pair permutations of uniform-width 1.5× cell structures 100A, 100B, 302 and 304 are contemplated.

In FIGS. 3A-3B, a stacking direction is parallel to the vertical direction. In some embodiments, rotation of 1.5× cell structures 302 and/or 304 is contemplated resulting in stacking directions other than the vertical direction.

FIGS. 4A and 4B are block diagrams of corresponding uniform-width 2.0× cell structures, in accordance with some embodiments. More particularly, FIGS. 4A and 4B are block diagrams of corresponding stacked pairings of uniform-width, 1.5× cell structures and uniform-width 2.0× cell structures, in accordance with some embodiments. In some embodiments, uniform-width, 2.0× cell structures 402 and 404 are used as standard cell structures in a library of standard cell structures.

In FIG. 4A, an instance of uniform-width, 1.5× cell structure 302 has an instance of a uniform-width, 2.0× cell structure 402 stacked thereon relative to the vertical direction. The 2.0× cell structure 402 is a version of 1.5× cell structure 304 such that 2.0× cell structure 402 includes an extra instance of NMOS row 102 which results, from top to bottom relative to the vertical direction, in an N-N-P-P arrangement. In particular, 2.0× cell structure 402 includes: two instances of NMOS row 102; and two instances of PMOS row 104. When 2.0× cell structure 402 is stacked on 1.5× cell structure 302, one of the two instances of PMOS row 104 in 2.0× cell structure 402 is contiguous in the vertical direction with the one of the two instances of NMOS row 102 in 1.5× cell structure 302. In some embodiments, an instance of 1.5× cell structure 302 is stacked on an instance of 2.0× cell structure 402 relative to the vertical direction.

In FIG. 4B, an instance of uniform-width, 1.5× cell structure 100B has an instance of a uniform-width, 2.0× cell structure 404 stacked thereon relative to the vertical direction. The 2.0× cell structure 404 is a version of 1.5× cell structure 100A such that 2.0× cell structure 404 includes an extra instance of PMOS row 104 which results, from top to bottom relative to the vertical direction, in an P-P-N-N arrangement. In particular, 2.0× cell structure 404 includes: two instances of NMOS row 102; and two instances of PMOS row 104. When 2.0× cell structure 404 is stacked on 1.5× cell structure 100B, one of the two instances of NMOS row 102 in 2.0× cell structure 404 is contiguous in the vertical direction with the one of the two instances of PMOS row 104 in 1.5× cell structure 100B. In some embodiments, an instance of 1.5× cell structure 100B is stacked on an instance of 2.0× cell structure 404 relative to the vertical direction. In some embodiments, other stacked pair permutations including (A) one of uniform-width 1.5× cell structures 100A, 100B, 302 or 304 and (B) one of uniform-width 2.0× cell structures 402 or 404 are contemplated.

In FIG. 4A, 2.0× cell structure 402 has a PR boundary 406A. In FIG. 4B, 2.0× cell structure 404 has a PR boundary 406B. Each of PR boundary 406A and PR boundary 406B is a rectangle, with a long axis of the rectangle being substantially parallel to the vertical direction.

In FIGS. 4A-4B, a stacking direction is parallel to the vertical direction. In some embodiments, rotation of 2.0× cell structures 402 and/or 404 is contemplated resulting in stacking directions other than the vertical direction.

FIGS. 5A and 5B are block diagrams of corresponding uniform-width 2.5× cell structures, in accordance with some embodiments. More particularly, FIGS. 5A and 5B are block diagrams of corresponding stacked pairings of uniform-width, 1.5× cell structures and uniform-width 2.5× cell structures, in accordance with some embodiments. In some embodiments, uniform-width, 2.5× cell structures 502 and 504 are used as standard cell structures in a library of standard cell structures.

In FIG. 5A, an instance of uniform-width, 1.5× cell structure 302 has an instance of a uniform-width, 2.5× cell structure 502 stacked thereon relative to the vertical direction. The 2.5× cell structure 502 is a version of uniform-width, 2.0× cell structure 402 such that 2.5× cell structure 502 includes an extra instance of PMOS row 104 which results, from top to bottom relative to the vertical direction, in a P-N-N-P-P arrangement. In particular, 2.5× cell structure 502 includes: two instances of NMOS row 102; and three instances of PMOS row 104. When 2.5× cell structure 502 is stacked on 1.5× cell structure 302, one of the three instances of PMOS row 104 in 2.5× cell structure 502 is contiguous in the vertical direction with the one of the two instances of NMOS row 102 in 1.5× cell structure 302. In some embodiments, an instance of 1.5× cell structure 100B is stacked on an instance of 2.5× cell structure 502 relative to the vertical direction.

In FIG. 5B, an instance of uniform-width, 1.5× cell structure 100B has an instance of a uniform-width, 2.5× cell structure 504 stacked thereon relative to the vertical direction. The 2.5× cell structure 504 is a version of uniform-width, 2.0× cell structure 404 such that 2.5× cell structure 504 includes an extra instance of NMOS row 102 which results, from top to bottom relative to the vertical direction, in an N-P-P-N-N arrangement. In particular, 2.5× cell structure 504 includes: three instances of NMOS row 102; and two instances of PMOS row 104. When 2.5× cell structure 504 is stacked on 1.5× cell structure 100B, one of the three instances of NMOS row 102 in 2.5× cell structure 504 is contiguous in the vertical direction with the one of the two instances of PMOS row 104 in 1.5× cell structure 100B. In some embodiments, an instance of 1.5× cell structure 302 is stacked on an instance of 2.5× cell structure 504 relative to the vertical direction. In some embodiments, other stacked pair permutations including (A) one of uniform-width 1.5× cell structures 100A, 100B, 302 or 304 or one of uniform-width 2.0× cell structures 402 or 404 and (B) one of uniform-width 2.5× cell structures 502 or 504 are contemplated.

In FIG. 5A, 2.5× cell structure 502 has a PR boundary 506A. In FIG. 5B, 2.5× cell structure 504 has a PR boundary 506B. Each of PR boundary 506A and PR boundary 506B is a rectangle, with a long axis of the rectangle being substantially parallel to the vertical direction.

In FIGS. 5A-5B, a stacking direction is parallel to the vertical direction. In some embodiments, rotation of 2.5× cell structures 502 and/or 504 is contemplated resulting in stacking directions other than the vertical direction.

FIGS. 6A and 6B are block diagrams of corresponding non-uniform-width, 1.0× cell structures 602 and 604, in accordance with some embodiments. More particularly, FIGS. 6A and 6B are block diagrams of corresponding stacked pairings of non-uniform-width, 1.0× cell structures and uniform-width 1.5× cell structures, in accordance with some embodiments. In some embodiments, non-uniform-width, 1.0× cell structures 602 and 604 are used as standard cell structures in a library of standard cell structures.

In FIG. 6A, a non-uniform-width, 1.0× cell structure 602 is stacked on an instance of uniform-width, 1.5× cell structure 302, relative to the vertical direction. In particular, non-uniform-width, 1.0× cell structure 602 has non-uniform width in the horizontal direction. The 1.0× cell structure 602 includes: one instance of a NMOS row 102; and one instance of PMOS row 104.

In non-uniform-width 1.0× cell structure 602, the one instance of NMOS row 102 is contiguous with the one instance of PMOS row 104 in the vertical direction. From top to bottom relative to the vertical direction, in the portion of 1.0× cell structure 602 in which a portion 608B of the one instance of PMOS row 104 is contiguous with the one instance of NMOS row 102, the result is a P-N arrangement.

In 1.0× cell structure 602 the one instance of NMOS row 102 has a first width W1 in the horizontal direction, and the one instance of PMOS row 104 has a second width W2 in the horizontal direction, the second width W2 being larger than the first width W1, such that W1<W2. In FIG. 6A, the first width W1 is substantially the same as the width of uniform-width 1.0× cell structure 302. Also in FIG. 6A, the second width W2 is substantially twice as large as the first width W1, such that W2≈2*W1. In some embodiments, other ratios between the first width W1 and the second width W2 are contemplated, such that W2=X*W1, where X is positive and 0<X. In some embodiments, X is a positive integer and 2<X.

In FIG. 6A, in some embodiments, the one instance of NMOS row 102 in 1.0× cell structure 602 is configured for NMOS finFET technology and the one instance of PMOS row 104 in 1.0× cell structure 602 is configured for PMOS finFET technology. In some embodiments, 1.5× cell structure 302 in FIG. 6A is similarly configured for finFET technology. In some embodiments, the one instance of NMOS row 102 in 1.0× cell structure 602 is configured for NMOS planar FET technology and the one instance of PMOS row 104 in 1.0× cell structure 602 is configured for PMOS planar technology. In some embodiments, 1.5× cell structure 302 in FIG. 6A is similarly configured for planar FET technology.

When non-uniform width, 1.0× cell structure 602 is stacked on uniform-width, 1.5× cell structure 302, a portion 608A of the one instance of PMOS row 104 in non-uniform width, 1.0× cell structure 602 is contiguous in the vertical direction with the one of the two instances of NMOS row 102 in 1.5× cell structure 302. Portion 608A is not contiguous in the vertical direction with the one instance of NMOS row 102 in non-uniform width, 1.0× cell structure 602.

In FIG. 6B, a 1.0× cell structure 604 is stacked on an instance of uniform-width, 1.5× cell structure 100B, relative to the vertical direction. In particular, 1.0× cell structure 604 has non-uniform width in the horizontal direction. The 1.0× cell structure 604 includes: one instance of a NMOS row 102; and one instance of PMOS row 104.

In non-uniform-width 1.0× cell structure 604, the one instance of NMOS row 102 is contiguous with the one instance of PMOS row 104 in the vertical direction. From top to bottom relative to the vertical direction, in the portion of 1.0× cell structure 602 in which a portion 610A of the one instance of NMOS row 102 is contiguous with the one instance of PMOS row 104, the result is an N-P arrangement.

In 1.0× cell structure 604, the one instance of PMOS row 104 has a first width W1 in the horizontal direction, and the one instance of NMOS row 102 has a second width W2 in the horizontal direction, the second width W2 being larger than the first width W1, such that W1 W2. In FIG. 6B, the first width W1 is substantially the same as the width of uniform-width 1.5× cell structure 100B. Also in FIG. 6B, the second width W2 is substantially twice as large as the first width such that W2≈2*W1. In some embodiments, other ratios between the first width W1 and the second width W2 are contemplated, such that W2=X*W1, where X is positive and 0<X. In some embodiments, X is a positive integer and 2<X.

In FIG. 6B, in some embodiments, the one instance of NMOS row 102 in 1.0× cell structure 604 is configured for NMOS finFET technology and the one instance of PMOS row 104 in 1.0× cell structure 604 is configured for PMOS finFET technology. In some embodiments, 1.5× cell structure 100B in FIG. 6B is similarly configured for finFET technology. In some embodiments, the one instance of NMOS row 102 in 1.0× cell structure 604 is configured for NMOS planar FET technology and the one instance of PMOS row 104 in 1.0× cell structure 604 is configured for PMOS planar technology. In some embodiments, 1.5× cell structure 100B in FIG. 6B is similarly configured for planar FET technology.

When non-uniform width, 1.0× cell structure 604 is stacked on uniform-width, 1.5× cell structure 100B, a portion 610B of the one instance of NMOS row 102 in 1.0× cell structure 604 is contiguous in the vertical direction with the one of the two instances of PMOS row 102 in 1.5× cell structure 100B Portion 610B is not contiguous in the vertical direction with the one instance of PMOS row 102 in 1.0× cell structure 604.

In FIGS. 6A-6B, a stacking direction is parallel to the vertical direction. In some embodiments, rotation of non-uniform-width 1.0 cell structures 602 and/or 604 is contemplated resulting in stacking directions other than the vertical direction. In some embodiments, other stacked pair permutations including (A) one of uniform-width 1.5× cell structures 100A, 100B, 302 or 304, uniform-width 2.0× cell structures 402 or 404, or uniform-width 2.5× cell structures 502 or 504 and (B) one of non-uniform-width, 1.0× cell structures 602 or 604 are contemplated.

In FIG. 6A, 1.0× cell structure 602 has a PR boundary 606A. In FIG. 6B, 1.0× cell structure 604 has a PR boundary 606B. Each of PR boundary 606A and PR boundary 606B is an L-shape.

Figures 7A, 7B:
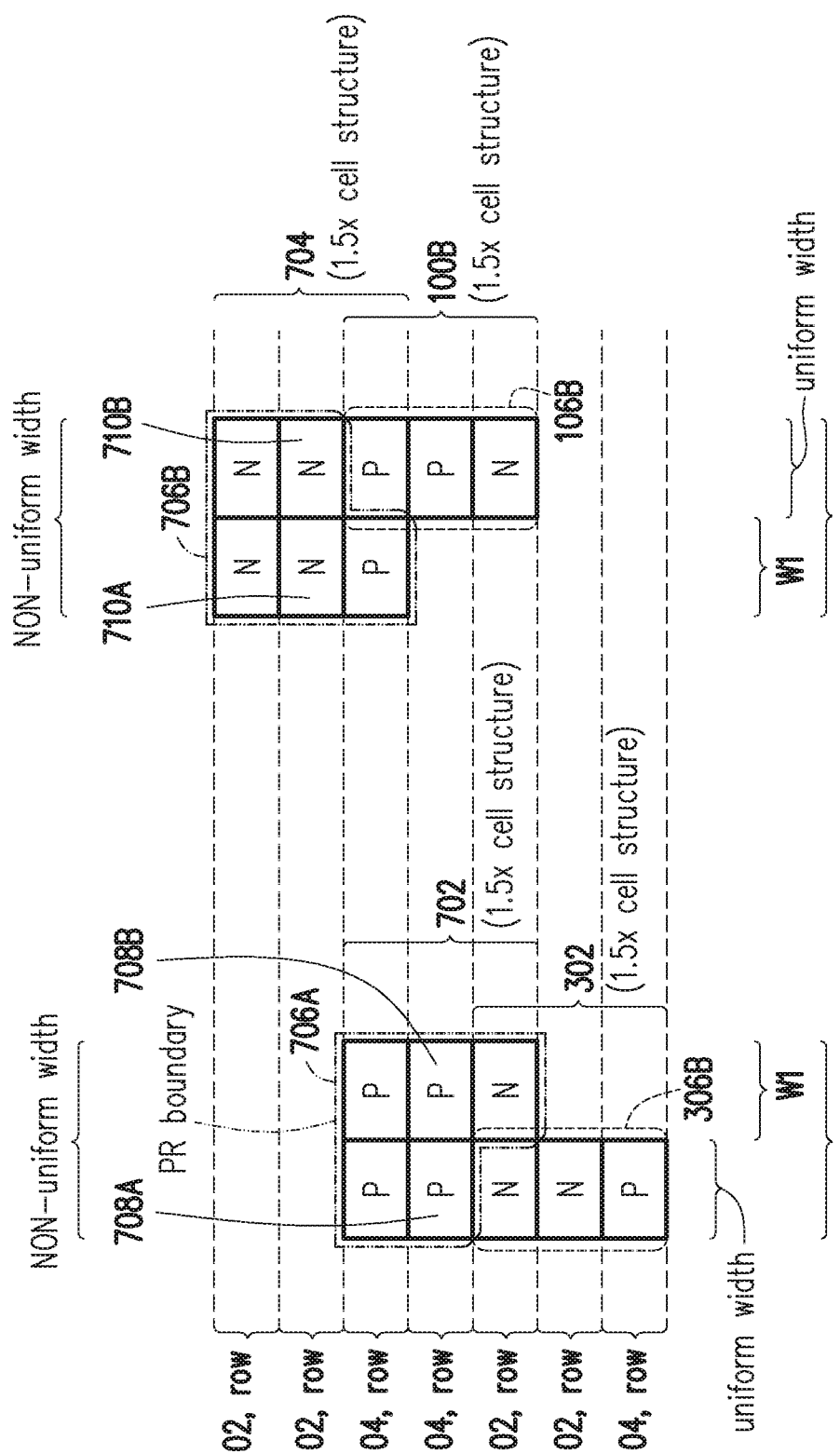
FIGS. 7A and 7B are block diagrams of corresponding non-uniform-width, 1.5× cell structures, in accordance with some embodiments.

FIGS. 7A and 7B are block diagrams of corresponding non-uniform-width, 1.5× cell structures 702 and 704, in accordance with some embodiments. More particularly, FIGS. 7A and 7B are block diagrams of corresponding stacked pairings of non-uniform-width, 1.5× cell structures and uniform-width 1.5× cell structures, in accordance with some embodiments. In some embodiments, non-uniform-width, 1.5× cell structures 702 and 704 are used as standard cell structures in a library of standard cell structures.

In FIG. 7A, a non-uniform-width, 1.5× cell structure 702 is stacked on an instance of uniform-width, 1.5× cell structure 302, relative to the vertical direction. In particular, non-uniform-width, 1.5× cell structure 702 has non-uniform width in the horizontal direction. The 1.5× cell structure 702 is a version of 1.0× cell structure 602 such that 1.5× cell structure 702 includes an extra instance of PMOS row 104. More particularly, 1.5× cell structure 702 includes: one instance of NMOS row 102; and two instances of PMOS row 104. In 1.5× cell structure 702, the one instance of NMOS row 102 is contiguous with one of the two instances of PMOS row 104 in the vertical direction. From top to bottom relative to the vertical direction, in the portion of 1.5× cell structure 702 in which a portion 708B of one of the two instances of PMOS row 104 is contiguous with the one instance of NMOS row 102, the result is a P-P-N arrangement.

In 1.5× cell structure 702, the one instance of NMOS row 102 has a first width W1 in the horizontal direction, and the two instances of PMOS row 104 have a second width W2 in the horizontal direction, the second width W2 being larger than the first width W1, such that W1 W2. In FIG. 7A, the first width W1 is substantially the same as the width of uniform-width 1.5× cell structure 302. Also in FIG. 7A, the second width W2 is substantially twice as large as the first width W1, such that W2≈2*W1. In some embodiments, other ratios between the first width W1 and the second width W2 are contemplated, such that W2=X*W1, where X is positive and 0<X. In some embodiments, is a positive integer and 2<X.

In FIG. 7A, in some embodiments, the one instance of NMOS row 102 in 1.5× cell structure 702 is configured for NMOS finFET technology and the two instances of PMOS row 104 in 1.5× cell structure 702 are configured for PMOS finFET technology. In some embodiments, 1.5× cell structure 302 in FIG. 7A is similarly configured for finFET technology. In some embodiments, the one instance of NMOS row 102 in 1.5× cell structure 702 is configured for NMOS planar FET technology and the two instances of PMOS row 104 in 1.5× cell structure 702 are configured for PMOS planar technology. In some embodiments, 1.5× cell structure 302 in FIG. 7A is similarly configured for planar FET technology.

When non-uniform width, 1.5× cell structure 702 is stacked on uniform-width, 1.5× cell structure 302, a portion 708A of one of the two instances of PMOS row 104 in 1.5× cell structure 702 is contiguous in the vertical direction with the one of the two instances of NMOS row 102 in 1.5× cell structure 302. Portion 708A is not contiguous in the vertical direction with the one instance of NMOS row 102 in 1.5× cell structure 702.

In FIG. 7B, a non-uniform width, 1.5× cell structure 704 is stacked on an instance of uniform-width, 1.5× cell structure 100B, relative to the vertical direction. In particular, 1.5× cell structure 704 has non-uniform width in the horizontal direction. The 1.5× cell structure 704 is a version of 1.5× cell structure 604 such that 1.5× cell structure 704 includes an extra instance of NMOS row 102. More particularly, 1.5× cell structure 704 includes: two instances of NMOS row 102; and one instance of PMOS row 104. In 1.5× cell structure 704, the one instance of PMOS row 104 is contiguous with one of the two instances of NMOS row 102 in the vertical direction. From top to bottom relative to the vertical direction, in the portion of 1.5× cell structure 704 in where a portion 710B of one of the two instances of NMOS row 102 is contiguous with one of the two instances of PMOS row 104 in 1.5× cell structure 100B, the result is an N-N-P arrangement.

In 1.5× cell structure 704, the one instance of PMOS row 104 has a first width W1 in the horizontal direction, and each of the two instances of NMOS row 102 has a second width W2 in the horizontal direction, the second width W2 being larger than the first width W1, such that W1<W2. In FIG. 7B, the first width W1 is substantially the same as the width of uniform-width 1.5× cell structure 100B. Also in FIG. 7B, the second width W2 is substantially twice as large as the first width W1, such that W2≈2*W1. In some embodiments, other ratios between the first width and the second width W2 are contemplated, such that W2=X*W1, where X is positive and 0<X. In some embodiments, X is a positive integer and 2<X.

In FIG. 7B, in some embodiments, the two instances of NMOS row 102 in 1.5× cell structure 704 are configured for NMOS finFET technology and the one instance of PMOS row 104 in 1.5× cell structure 704 is configured for PMOS finFET technology. In some embodiments, 1.5× cell structure 100B in FIG. 7B is similarly configured for finFET technology. In some embodiments, the two instances of NMOS row 102 in 1.5× cell structure 704 are configured for NMOS planar FET technology and the one instance of PMOS row 104 in 1.5× cell structure 704 is configured for PMOS planar technology. In some embodiments, 1.5× cell structure 100B in FIG. 7B is similarly configured for planar FET technology.

When non-uniform width, 1.5× cell structure 704 is stacked on uniform-width, 1.5× cell structure 100B, a portion 710B of one of the two instances of NMOS row 102 in 1.5× cell structure 704 is contiguous in the vertical direction with one of the two instances of PMOS row 102 in 1.5× cell structure 100B. Portion 710B is not contiguous in the vertical direction with the one instance of PMOS row 102 in 1.5× cell structure 704.

In FIGS. 7A-7B, a stacking direction is parallel to the vertical direction. In some embodiments, rotation of non-uniform-width 1.5× cell structures 702 and/or 704 is contemplated resulting in stacking directions other than the vertical direction. In some embodiments, other stacked pair permutations including (A) one of uniform-width 1.5× cell structures 100A, 100B, 302 or 304, uniform-width 2.0× cell structures 402 or 404, uniform-width 2.5× cell structures 502 or 504 or non-uniform-width 1.0× cell structures 602 or 604 and (B) one of non-uniform-width, 1.5× cell structures 702 or 704 are contemplated.

In FIG. 7A, 1.5× cell structure 702 has a PR boundary 706A. In FIG. 7B, 1.5× cell structure 704 has a PR boundary 706B. Each of PR boundary 706A and PR boundary 706B is an L-shape.

Figures 8A, 8B:
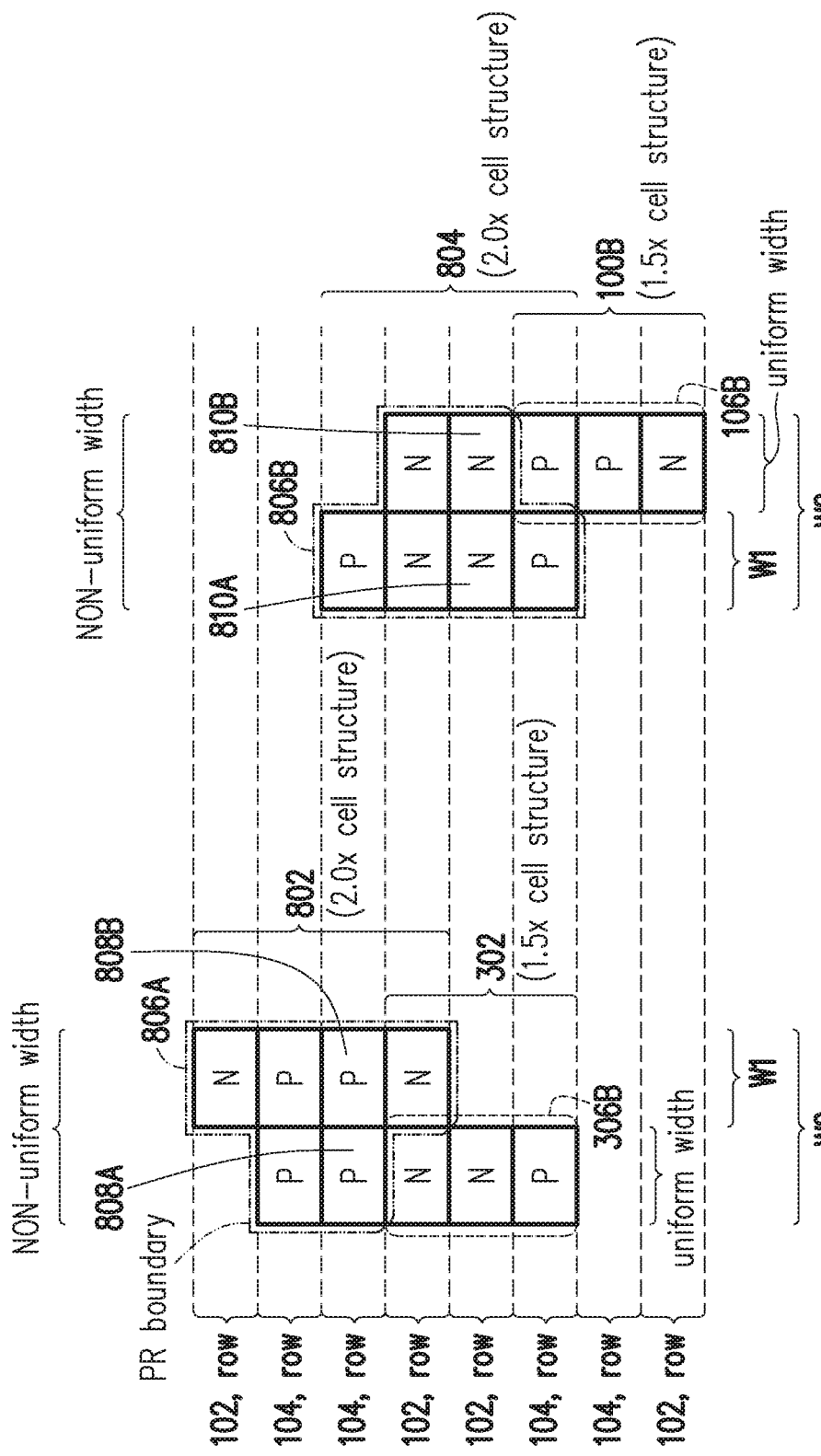
FIGS. 8A and 8B are block diagrams of corresponding non-uniform-width, 1.5× cell structures, in accordance with some embodiments.

FIGS. 8A and 8B are block diagrams of corresponding non-uniform-width, 2.0× cell structures 802 and 804, in accordance with some embodiments. More particularly, FIGS. 8A and 8B are block diagrams of corresponding stacked pairings of non-uniform-width, 2.0× cell structures and uniform-width 1.5× cell structures, in accordance with some embodiments. In some embodiments, non-uniform-width, 2.0× cell structures 802 and 804 are used as standard cell structures in a library of standard cell structures.

In FIG. 8A, a non-uniform-width, 2.0× cell structure 802 is stacked on an instance of uniform-width, 1.5× cell structure 302, relative to the vertical direction. In particular, non-uniform-width, 2.0× cell structure 802 has non-uniform width in the horizontal direction. The 2.0× cell structure 802 is a version of 1.5× cell structure 702 such that 2.0× cell structure 802 includes an extra instance of NMOS row 102. More particularly, 2.0× cell structure 802 includes: two instances of NMOS row 102; and two instances of PMOS row 104. In 2.0× cell structure 802, the two instances of PMOS row 104 are contiguous in the vertical direction, and each of the two instances of PMOS row 104 also is contiguous with a corresponding one of the two instances of NMOS row 102 in the vertical direction. From top to bottom relative to the vertical direction, in the portion of 2.0× cell structure 802 which includes a portion 808B of one of the two instances of PMOS row 104, the result is an N-P-P-N arrangement.

In 2.0× cell structure 802, each of the two instances of NMOS row 102 has a first width W1 in the horizontal direction, and each of the two instances of PMOS row 104 has a second width W2 in the horizontal direction, the second width W2 being larger than the first width W1, such that W1<W2. In FIG. 8A, the first width W1 is substantially the same as the width of uniform-width 1.5× cell structure 302. Also in FIG. 8A, the second width W2 is substantially twice as large as the first width W1, such that W2≈2*W1. In some embodiments, other ratios between the first width W1 and the second width W2 are contemplated, such that W2=X*W1, where X is positive and 0<X. In some embodiments, X is a positive integer and 2<X.

In FIG. 8A, in some embodiments, the two instances of NMOS row 102 in 2.0× cell structure 802 are configured for NMOS finFET technology and the two instances of PMOS row 104 in 2.0× cell structure 802 are configured for PMOS finFET technology. In some embodiments, 1.5× cell structure 302 in FIG. 8A is similarly configured for finFET technology. In some embodiments, the two instances of NMOS row 102 in 2.0× cell structure 802 are configured for NMOS planar FET technology and the two instances of PMOS row 104 in 2.0× cell structure 802 are configured for PMOS planar technology. In some embodiments, 1.5× cell structure 302 in FIG. 8A is similarly configured for planar FET technology.

When non-uniform width, 2.0× cell structure 802 is stacked on uniform-width, 1.5× cell structure 302, a portion 808A of one of the two instances of PMOS row 104 in 2.0× cell structure 802 is contiguous in the vertical direction with the one of the two instances of NMOS row 102 in 1.5× cell structure 302. Portion 808A is not contiguous in the vertical direction with either of the two instances of NMOS row 102 in 2.0× cell structure 802.

In FIG. 8B, a non-uniform-width, 2.0× cell structure 804 is stacked on an instance of uniform-width, 1.5× cell structure 100B, relative to the vertical direction. In particular, non-uniform-width, 2.0× cell structure 804 has non-uniform width in the horizontal direction. The 2.0× cell structure 804 is a version of 1.5× cell structure 704 such that 2.0× cell structure 804 includes an extra instance of PMOS row 104. More particularly, 2.0× cell structure 804 includes: two instances of NMOS row 102; and two instances of PMOS row 104. In 2.0× cell structure 804, the two instances of NMOS row are contiguous in the vertical direction, and each of the two instances of NMOS row 102 also is contiguous with a corresponding one of the two instances of PMOS row 104 in the vertical direction. From top to bottom relative to the vertical direction, in the portion of 2.0× cell structure 804 which includes a portion 810A of one of the two instances of NMOS row 102, the result is a P-N-N-P arrangement.

In 2.0× cell structure 804, each of the two instances of PMOS row 104 has a first width W1 in the horizontal direction, and each of the two instances of NMOS row 102 has a second width W2 in the horizontal direction, the second width W2 being larger than the first width W1, such that W1<W2. In FIG. 8B, the first width W1 is substantially the same as the width of uniform-width 1.5× cell structure 100B. Also in FIG. 8B, the second width W2 is substantially twice as large as the first width W1, such that W2≈2*W1. In some embodiments, other ratios between the first width W1 and the second width W2 are contemplated, such that W2=X*W1, where X is positive and 0<X. In some embodiments, X is a positive integer and 2<X.

In FIG. 8B, in some embodiments, the two instances of NMOS row 102 in 2.0× cell structure 804 are configured for NMOS finFET technology and the two instances of PMOS row 104 in 2.0× cell structure 804 are configured for PMOS finFET technology. In some embodiments, 1.5× cell structure 100B in FIG. 8B is similarly configured for finFET technology. In some embodiments, the two instances of NMOS row 102 in 2.0× cell structure 804 are configured for NMOS planar FET technology and the two instances of PMOS row 104 in 2.0× cell structure 804 are configured for PMOS planar technology. In some embodiments, 1.5× cell structure 100B in FIG. 8B is similarly configured for planar FET technology.

When non-uniform width, 2.0× cell structure 804 is stacked on uniform-width, 1.5× cell structure 100B, a portion 810B of one of the two instances of NMOS row 102 in 2.0× cell structure 804 is contiguous in the vertical direction with one of the two instances of PMOS row 104 in 1.5× cell structure 100B. Portion 810B is not contiguous in the vertical direction with either of two instance of PMOS row 102 in 2.0× cell structure 804.

In FIGS. 8A-8B, a stacking direction is parallel to the vertical direction. In some embodiments, rotation of non-uniform-width 2.0× cell structures 802 and/or 804 is contemplated resulting in stacking directions other than the vertical direction. In some embodiments, other stacked pair permutations including (A) one of uniform-width 1.5× cell structures 100A, 100B, 302 or 304, uniform-width 2.0× cell structures 402 or 404, uniform-width 2.5× cell structures 502 or 504, non-uniform-width 1.0× cell structures 602 or 604 or non-uniform-width 1.5× cell structures 702 or 704 and (B) one of non-uniform-width, 2.0× cell structures 802 or 804 are contemplated.

In FIG. 8A, 2.0× cell structure 802 has a PR boundary 806A. In FIG. 8B, 2.0× cell structure 804 has a PR boundary 806B. Each of PR boundary 806A and PR boundary 806B is a T-shape.

Figure 9:
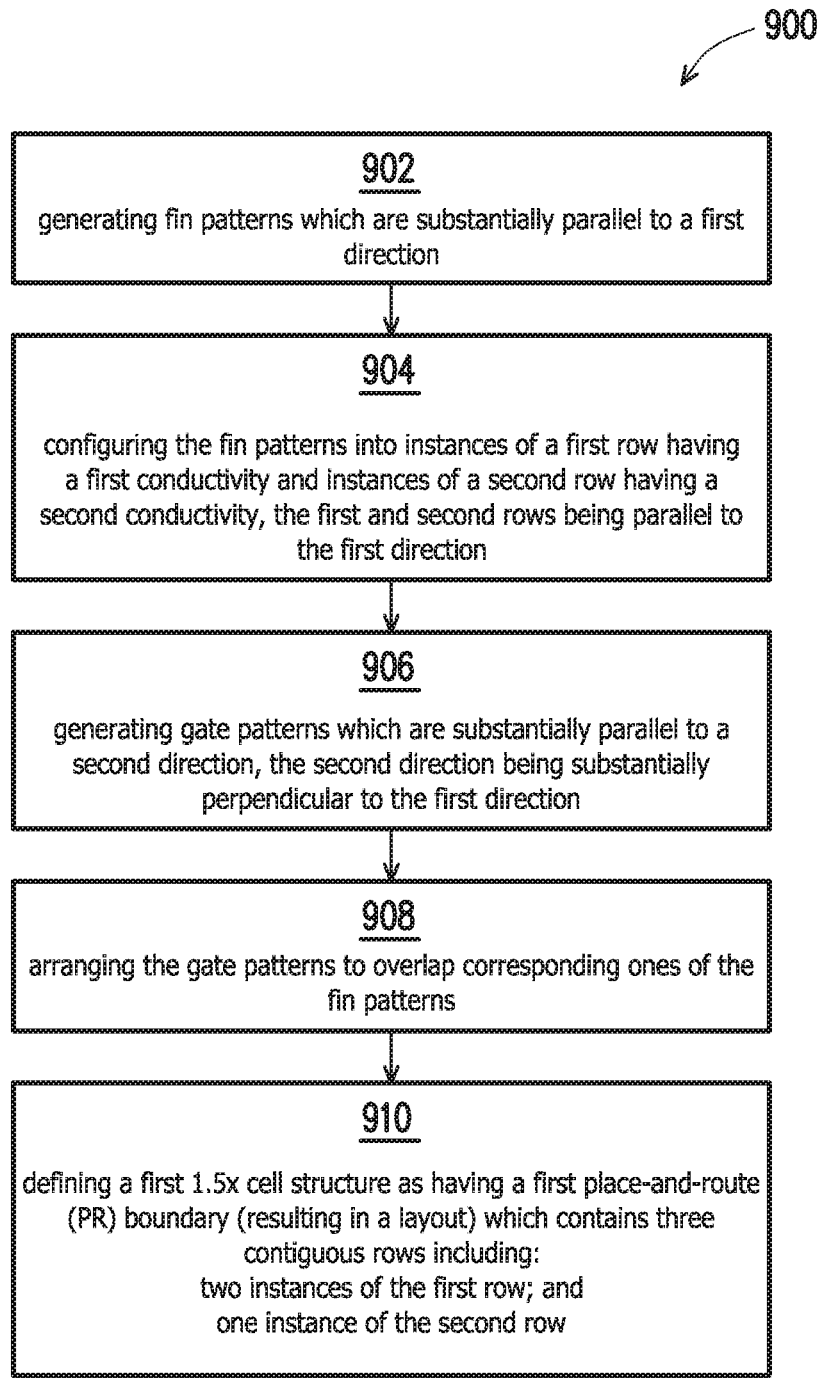
FIG. 9 is a flowchart of a method of generating a layout, in accordance with some embodiments.

FIG. 9 is a flowchart of a method 900 of generating a layout, in accordance with some embodiments. In some embodiments, method 900 is used to generate an instance of uniform-width, 1.5× cell structure 100A, 100B, 302, 304, or the like. Method 900 is applicable to generating other instances of uniform-width 1.5× cell structures.

At a block 902 of FIG. 9, fin patterns are generated. The fin patterns are arranged substantially collinearly with respect to corresponding parallel imaginary first reference lines of a first imaginary array, the first reference lines lying parallel to a first direction. In some embodiments, the first direction is the horizontal direction. Examples of such fin patterns are fin patterns 122A, 122B and 122C in FIGS. 1C-1D, or the like.

From block 902, flow proceeds to a block 904. At block 904, the fin patterns are configured into instances of a first row having a first conductivity and instances of a second row having a second conductivity, the first and second rows being parallel to the first direction. Each instance of the first row and each instance of the second row are configured to include a predetermined number of the first reference lines. Each instance of the first row is configured to include one or more fin patterns of the first conductivity type. Each instance of the second row is configured to include one or more fin patterns of the second conductivity type. Examples of such rows are instances of row 102 and instances of row 104 in FIGS. 1C-1D, or the like. From block 904, flow proceeds to a block 906.

At block 906, gate patterns are generated. The gate patterns are arranged substantially collinearly to corresponding parallel imaginary second reference lines of a second imaginary array, the second reference lines lying a second direction, the second direction being substantially perpendicular to the first direction. In some embodiments, the second direction is the vertical direction. Examples of such gate patterns are instances of gate pattern 124 in FIGS. 1C-1D, or the like. From block 906, flow proceeds to a block 908. At block 908, the gate patterns are arranged to overlap corresponding ones of the fin patterns. Again, examples of such gate patterns are instances of gate pattern 124 in FIGS. 1C-1D, or the like. From block 908, flow proceeds to a block 910.

At block 910, a first 1.5× cell structure is defined as having a PR boundary which contains contiguous rows. The first 1.5× cell structure includes: two instances of the first row; and one instance of the second row. An example of the first 1.5× cell structure includes an instance of uniform-width, 1.5× cell structure 100A, 100B, 302, 304, or the like. In some embodiments, the two instances of the first row in the first 1.5× cell structure are located so as to be contiguous. In some embodiments, a uniform-width (in the first direction) of the rows of the first 1.5× cell structure is maintained.

In some embodiments, after block 910, a second 1.5× cell structure is defined as having a PR boundary which contains contiguous rows. The second 1.5× cell structure includes: two instances of the first row; and one instance of the second row. An example of the second 1.5× cell structure includes an instance of uniform-width 1.5× cell structure 100A, 100B, 302, 304, or the like. In some embodiments, the two instances of the first row in the second 1.5× cell structure are located so as to be contiguous. 1n some embodiments, a uniform-width (in the first direction) of the rows of the second 1.5× cell structure is maintained. In some embodiments, the second 1.5× cell structure is stacked on the first 1.5× cell structure. In some embodiments, the first 1.5× cell structure is stacked on the second 1.5× cell structure.

In some embodiments, after block 910, a first 2.0 cell structure is defined as having a boundary (resulting in a layout) which contains four contiguous rows. The first 2.0× cell structure includes: two instances of the first row; and two instances of the second row. An example of the first 2.0× cell structure includes an instance of uniform-width, 2.0× cell structure 402 or 404, or the like. In some embodiments, the two instances of the first row in the first 2.0× cell structure are located so as to be contiguous and the two instances of second row in the first 2.0× cell structure are located so as to be contiguous. In some embodiments, a uniform-width (in the first direction) of the rows of the second 2.0× cell structure is maintained. In some embodiments, the first 2.0× cell structure is stacked on the first 1.5× cell structure. In some embodiments, the first 1.5× cell structure is stacked on the first 2.0× cell structure.

In some embodiments, after block 910, based on the layout, at least one of (A) one or more semiconductor masks or (B) at least one component in a layer of an inchoate semiconductor integrated circuit is fabricated. See discussion of FIG. 13, below.

Figure 10:
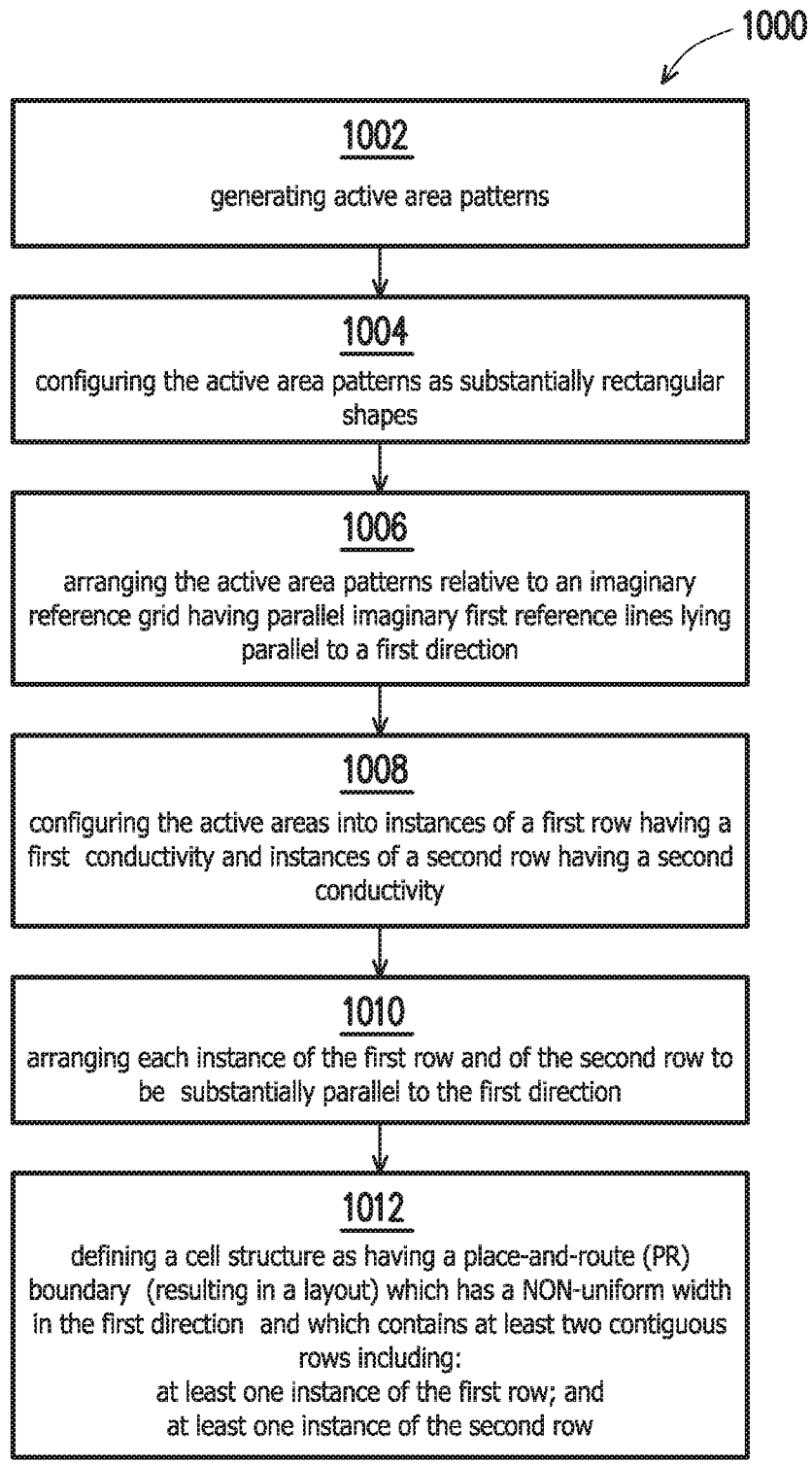
FIG. 10 is a flowchart of another method of generating a layout, in accordance with some embodiments.

FIG. 10 is a flowchart of a method 1000 of generating a layout, in accordance with some embodiments. In some embodiments, method 1000 is used to generate an instance of non-uniform-width, 1.0× cell structure 602 or 604, non-uniform-width, 1.5× cell structure 702 or 704, or non-uniform-width, 2.0× cell structure 802 or 804, or the like. Method 1000 is applicable to generating other instances of non-uniform-width 1.0× cell structures, 1.5× cell structures, and/or 2.0× cell structures.

At block 1002 of FIG. 10, active area patterns are generated. From block 1002, flow proceeds to a block 1004, where the active area patterns are configured as predetermined shapes, e.g., substantially rectangular shapes. From block 1004, flow proceeds to a block 1006. At block 1006, the active area patterns are arranged relative to an imaginary reference grid which includes parallel imaginary first reference lines lying parallel to a first direction. In some embodiments, the first direction is the horizontal direction. From block 1006, flow proceeds to a block 1008. At block 1008, the active area patterns are configured into instances of a first row having a first conductivity and instances of a second row having a second conductivity. From block 1008, flow proceeds to a block 1010. At block 1010, each instance of the first row and of the second row is arranged to be substantially parallel to the first direction. Each instance of the first row and of the second row to include a predetermined number of the first reference lines. Examples of such rows are instances of row 102 and instances of row 104 in FIGS. 6A-6B, 7A-7B and 8A-8B, or the like. From block 1010, flow proceeds to a block 1012.

At block 1012, a cell structure is defined as having a PR boundary which contains at least two contiguous rows. More particularly, the cell structure includes: at least one instance of the first row; and at least one instance of the second row. The cell structure has non-uniform width in the first direction.

The at least one instance of the first row in the cell structure has a first width in the first direction. The at least one instance of the second row in the cell structure has a second width in the first direction. The second width is set to be substantially twice as large as the first width.

In some embodiments, the cell structure is defined to be a 1.5× cell structure such that the PR boundary contains contiguous rows including: two instances of the first row; and one instance of the second row. The two instances of the first row in the 1.5× cell structure are located so as to be contiguous. Examples of such cell structures include cell structures 702 and 704, or the like.

In some embodiments, the cell structure is defined to be a 2.0× cell structure such that the PR boundary contains four contiguous rows including: two instances of the first row; and two instances of the second row. In some embodiments, the two instances of the first row are configured to be contiguous. In some embodiments, the two instances of the second row are configured to be contiguous. Examples of such cell structures include cell structures 802 and 804, or the like.

In some embodiments, the periphery of the cell structure is configured to be L-shaped. Examples of such cell structures include cell structures 602, 604, 702 and 704, or the like. In some embodiments, the periphery of the cell structure is configured to be T-shaped. Examples of such cell structures include cell structures 802 and 804, or the like. In some embodiments, the active area patterns are configured for finFET technology.

In some embodiments, after block 1012, based on the layout, at least one of (A) one or more semiconductor masks or (B) at least one component in a layer of an inchoate semiconductor integrated circuit is fabricated. See discussion of FIG. 13, below.

Figure 11:
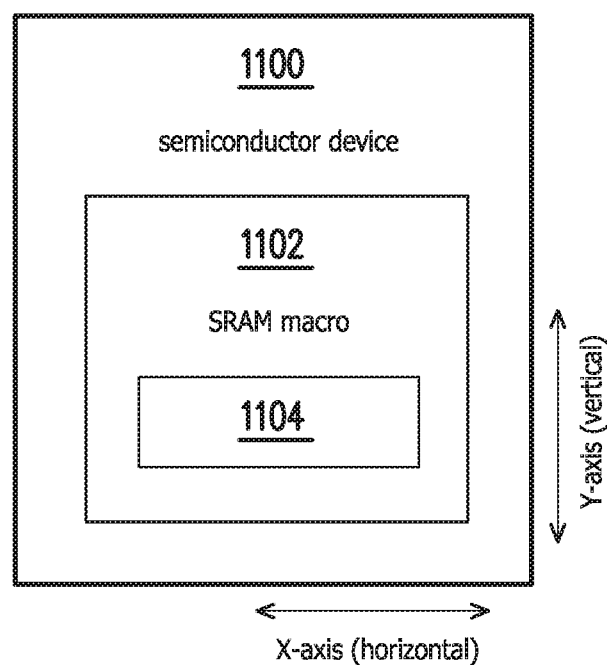
FIG. 11 is a block diagram of a semiconductor device in accordance with at least one embodiment of the present disclosure.

FIG. 11 is a block diagram of a semiconductor device 1100 in accordance with at least one embodiment of the present disclosure.

In FIG. 11, semiconductor device 1100 includes, among other things, an SRAM macro 1102. In some embodiment, macro 1102 is a macro other than an SRAM. SRAM macro 1102 includes, among other things, a circuit 1104. Circuit 1104 is implemented from any of cell structures 100A, 100B, 302, 304, 402, 404, 502, 504, 602, 604, 702, 704, 802 or 804. L-shaped cell structures 602, 604, 704 and 704 are shown in corresponding FIGS. 6A-6B and 7A-B. T-shaped cell structures 802 and 804 are shown in FIGS. 8A-8B.

Figure 12:
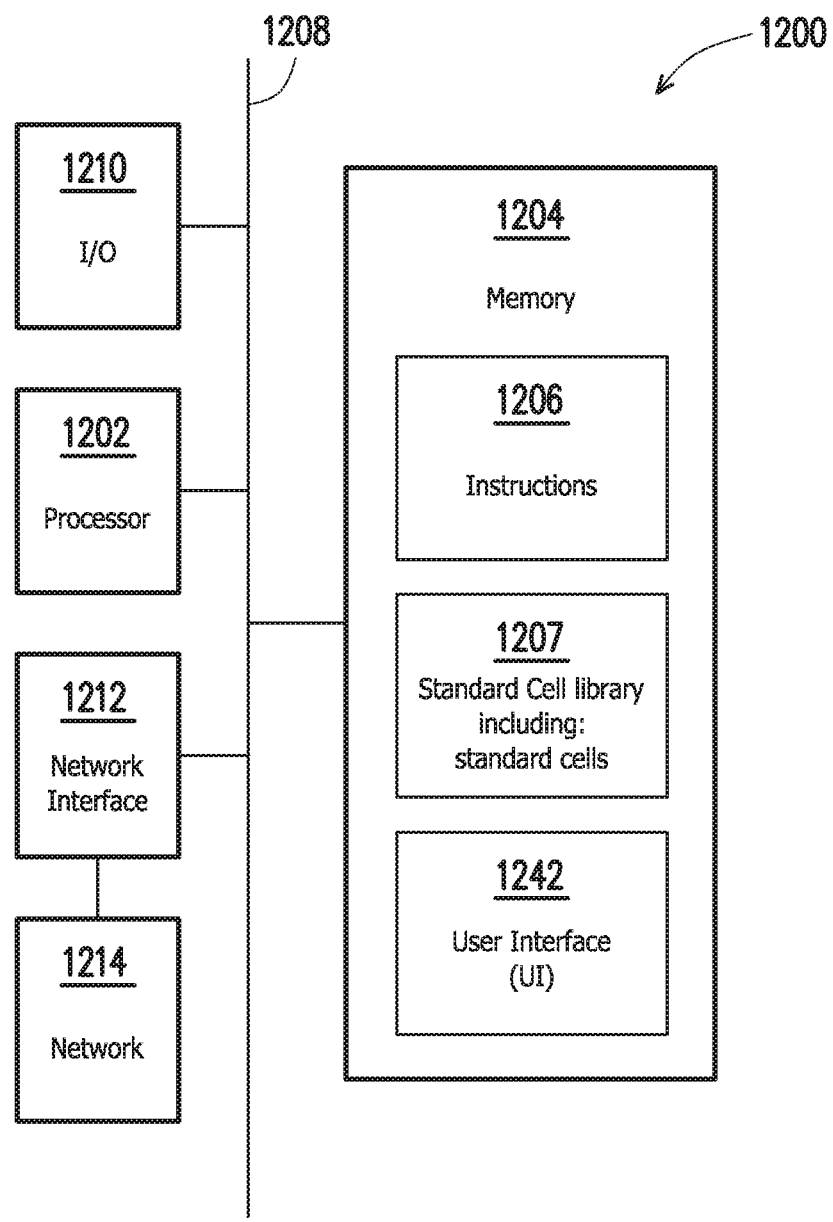
FIG. 12 is a block diagram of an electronic design automation (EDA) system in accordance with some embodiments.

FIG. 12 is a block diagram of an electronic design automation (EDA) system 1200 in accordance with some embodiments.

In some embodiments, EDA system 1200 includes an APR system. The method of flowchart 900 of FIG. 9 is implemented, for example, using EDA system 1200, in accordance with some embodiments, in order to generate an instance of uniform-width, 1.5× cell structure 100A, 100B, 302, 304, or the like. The method of flowchart 1000 of FIG. 10 is implemented, for example, using EDA system 1200, in accordance with some embodiments, in order to generate an instance of non-uniform-width, 1.0× cell structure 602 or 604, non-uniform-width, 1.5× cell structure 702 or 704, or non-uniform-width, 2.0× cell structure 802 or 804, or the like.

In some embodiments, EDA system 1200 is a general purpose computing device including a hardware processor 1202 and a non-transitory, computer-readable storage medium 1204. Storage medium 1204, amongst other things, is encoded with, i.e., stores, computer program code 1206, i.e., a set of executable instructions. Execution of instructions 1206 by hardware processor 1202 represents (at least in part) an EDA tool which implements a portion or all of, e.g., the methods of FIGS. 9-10, in accordance with one or more embodiments (hereinafter, the noted processes and/or methods).

Processor 1202 is electrically coupled to computer-readable storage medium 1204 via a bus 1208. Processor 1202 is also electrically coupled to an I/O interface 1210 by bus 1208. A network interface 1212 is also electrically connected to processor 1202 via bus 1208. Network interface 1212 is connected to a network 1214, so that processor 1202 and computer-readable storage medium 1204 are capable of connecting to external elements via network 1214. Processor 1202 is configured to execute computer program code 1206 encoded in computer-readable storage medium 1204 in order to cause system 1200 to be usable for performing a portion or all of the noted processes and/or methods. In one or more embodiments, processor 1202 is a central processing unit (CPU), a multi-processor, a distributed processing system, an application specific integrated circuit (ASIC), and/or a suitable processing unit.

In one or more embodiments, computer-readable storage medium 1204 is an electronic, magnetic, optical, electromagnetic, infrared, and/or a semiconductor system (or apparatus or device). For example, computer-readable storage medium 1204 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1204 includes a compact disk-read only memory (CD-ROM), a compact disk-read/write (CD-R/W), and/or a digital video disc (DVD).

In one or more embodiments, storage medium 1204 stores computer program code 1206 configured to cause system 1200 (where such execution represents (at least in part) the EDA tool) to be usable for performing a portion or all of the noted processes and/or methods. In one or more embodiments, storage medium 1204 also stores information which facilitates performing a portion or all of the noted processes and/or methods. In one or more embodiments, storage medium 1204 stores library 1207 of standard cells including such standard cells as disclosed herein.

EDA system 1200 includes I/O interface 1210. I/O interface 1210 is coupled to external circuitry. In one or more embodiments, I/O interface 1210 includes a keyboard, keypad, mouse, trackball, trackpad, touchscreen, and/or cursor direction keys for communicating information and commands to processor 1202.

EDA system 1200 also includes network interface 1212 coupled to processor 1202. Network interface 1212 allows system 1200 to communicate with network 1214, to which one or more other computer systems are connected. Network interface 1212 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 1200.

System 1200 is configured to receive information through I/O interface 1210. The information received through I/O interface 1210 includes one or more of instructions, data, design rules, libraries of standard cells, and/or other parameters for processing by processor 1202. The information is transferred to processor 1202 via bus 1208. EDA system 1200 is configured to receive information related to a UI through I/O interface 1210. The information is stored in computer-readable medium 1204 as user interface (UI) 1242.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1200. In some embodiments, a layout which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 13:
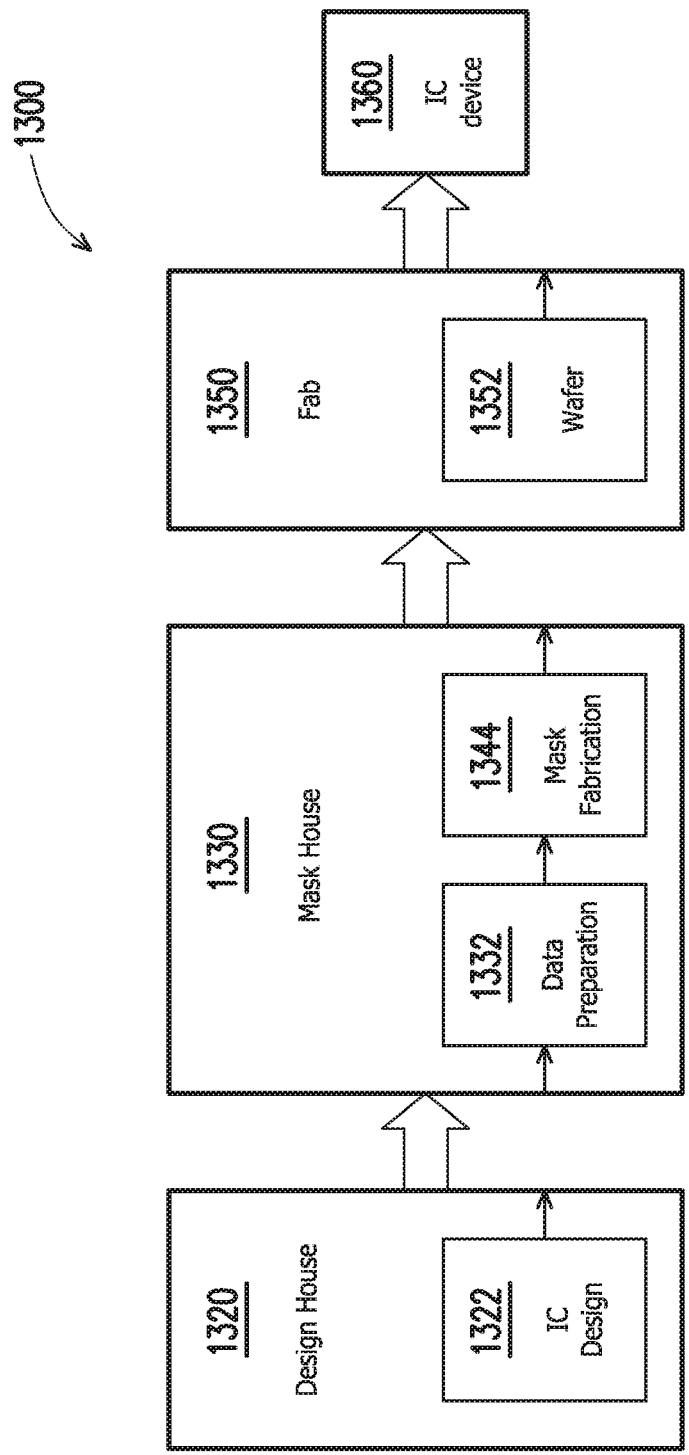
FIG. 13 is a block diagram of an integrated circuit (IC) manufacturing system, and an IC manufacturing flow associated therewith, in accordance with some embodiments.

FIG. 13 is a block diagram of an integrated circuit (IC) manufacturing system 1300, and an IC manufacturing flow associated therewith, in accordance with some embodiments. In some embodiments, after block 910 of FIG. 9, based on the layout, at least one of (A) one or more semiconductor masks or (B) at least one component in a layer of an inchoate semiconductor integrated circuit is fabricated using manufacturing system 1300. In some embodiments, after block 1012 of FIG. 10, based on the layout, at least one of (A) one or more semiconductor masks or (B) at least one component in a layer of an inchoate semiconductor integrated circuit is fabricated In FIG. 13, IC manufacturing system 1300 includes entities, such as a design house 1320, a mask house 1330, and an IC manufacturer/fabricator ("fab") 1350, that interact with one another in the design, development, and manufacturing cycles and/or services related to manufacturing an IC device 1360. The entities in system 1300 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1320, mask house 1330, and IC fab 1350 is owned by a single larger company. In some embodiments, two or more of design house 1320, mask house 1330, and IC fab 1350 coexist in a common facility and use common resources.

Design house (or design team) 1320 generates an IC design layout 1322. IC design layout 1322 includes various geometrical patterns designed for an IC device 1360. The geometrical patterns correspond to patterns of metal, oxide, or semiconductor layers that make up the various components of IC device 1360 to be fabricated. The various layers combine to form various IC features. For example, a portion of IC design layout 1322 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1320 implements a proper design procedure to form IC design layout 1322. The design procedure includes one or more of logic design, physical design or place and route. IC design layout 1322 is presented in one or more data files having information of the geometrical patterns. For example, IC design layout 1322 can be expressed in a GDSII file format or DFII file format.

Mask house 1330 includes data preparation 1332 and mask fabrication 1344. Mask house 1330 uses IC design layout 1322 to manufacture one or more masks to be used for fabricating the various layers of IC device 1360 according to IC design layout 1322. Mask house 1330 performs mask data preparation 1332, where IC design layout 1322 is translated into a representative data file ("RDF"). Mask data preparation 1332 provides the RDF to mask fabrication 1344. Mask fabrication 1344 includes a mask writer. A mask writer converts the RDF to an image on a substrate, such as a mask (reticle) or a semiconductor wafer. The design layout is manipulated by mask data preparation 1332 to comply with particular characteristics of the mask writer and/or requirements of IC fab 1350. In FIG. 13, mask data preparation 1332 and mask fabrication 1344 are illustrated as separate elements. In some embodiments, mask data preparation 1332 and mask fabrication 1344 can be collectively referred to as mask data preparation.

In some embodiments, mask data preparation 1332 includes optical proximity correction (OPC) which uses lithography enhancement techniques to compensate for image errors, such as those that can arise from diffraction, interference, other process effects and the like. OPC adjusts IC design layout 1322. In some embodiments, mask data preparation 1332 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1332 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 1344, which may undo part of the modifications performed by OPC in order to meet mask creation rules.

In some embodiments, mask data preparation 1332 includes lithography process checking (LPC) that simulates processing that will be implemented by IC fab 1350 to fabricate IC device 1360. LPC simulates this processing based on IC design layout 1322 to create a simulated manufactured device, such as IC device 1360. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout 1322.

It should be understood that the above description of mask data preparation 1332 has been simplified for the purposes of clarity. In some embodiments, data preparation 1332 includes additional features such as a logic operation (LOP) to modify the IC design layout according to manufacturing rules. Additionally, the processes applied to IC design layout 1322 during data preparation 1332 may be executed in a variety of different orders.

After mask data preparation 1332 and during mask fabrication 1344, a mask or a group of masks are fabricated based on the modified IC design layout. In some embodiments, an electron-beam (e-beam) or a mechanism of multiple e-beams is used to form a pattern on a mask (photomask or reticle) based on the modified IC design layout. The mask can be formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask can be attenuated PSM or alternating PSM. The mask(s) generated by mask fabrication 1344 is used in a variety of processes. For example, such a mask(s) is used in an ion implantation process to form various doped regions in the semiconductor wafer, in an etching process to form various etching regions in the semiconductor wafer, and/or in other suitable processes.

IC fab 1350 is an IC fabrication business that includes one or more manufacturing facilities for the fabrication of a variety of different IC products. In some embodiments, IC Fab 1350 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BOL) fabrication), and a third manufacturing facility may provide other services for the foundry business.

IC fab 1350 uses the mask (or masks) fabricated by mask house 1330 to fabricate IC device 1360. Thus, IC fab 1350 at least indirectly uses IC design layout 1322 to fabricate IC device 1360. In some embodiments, a semiconductor wafer 1352 is fabricated by IC fab 1350 using the mask (or masks) to form IC device 1360. Semiconductor wafer 1352 includes a silicon substrate or other proper substrate having material layers formed thereon. Semiconductor wafer further includes one or more of various doped regions, dielectric features, multilevel interconnects, and the like (formed at subsequent manufacturing steps).

Details regarding an integrated circuit (IC) manufacturing system (e.g., system 1300 of FIG. 13), and an IC manufacturing flow associated therewith are found, e.g., in U.S. Pat. No. 9,256,709, granted Feb. 9, 2016, U.S. Pre-Grant Publication No, 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

An aspect of the present disclosure is directed to a semiconductor device comprising: fins formed on a substrate and arranged substantially parallel to a first direction; the fins being organized into instances of a first row and instances of a second row; each instance of the first row including a first predetermined number of fins having a first conductivity type; and each instance of the second row including a second predetermined number of fins having a second conductivity type; gate structures formed over corresponding ones of the fins and arranged substantially parallel to a second direction, the second direction being substantially perpendicular to the first direction; and a first structure having an odd number of contiguous rows including: an even number of instances of the first row; and an odd number of instances of the second row. Regarding some embodiments, each of the even number of instances of the first row in the first structure has a first width in the first direction; and each of the odd number of instances of the second row in the first structure has a second width in the first direction, the second width being substantially different than the first width. Regarding some embodiments, a size in the first direction of each row is substantially the same.

Another aspect of the present disclosure is directed to a semiconductor device comprising: active areas formed as predetermined shapes on a substrate and arranged relative to a grid having first and second tracks which are substantially parallel to corresponding orthogonal first and second directions; the active areas being organized into instances of a first row having a first conductivity and instances of a second row having a second conductivity; each instance of the first row and of the second row including a corresponding first and second number predetermined number of the first tracks; and a structure having at least two contiguous rows including: at least one instance of the first row; and at least one instance of the second row; wherein: each of the at least one instance of the first row in the structure has a first width in the first direction; and each of the at least one instance of the second row in the structure has a second width in the first direction, the second width being substantially different than the first width. Regarding some embodiments, the structure has two contiguous rows. Regarding some embodiments, the second width is substantially twice the first width. Regarding some embodiments, one of the following is true: the structure has an odd number of contiguous rows including: an even number of instances of the first row; and an odd number of instances of the second row; or the structure has an even number of contiguous rows including: at least one instance of the first row; and at least one instance of the second row. Regarding some embodiments, one of the following is true: in the structure which has an odd number of contiguous rows, at least two of the even number of one or more instances of the first row are contiguous; or the structure which has an even number of contiguous rows includes at least two instances of the first row and at least two instances of the second row, wherein, two or more of the at least two instances of the first row are contiguous. Regarding some embodiments, a perimeter of the structure is L-shaped. Regarding some embodiments, a perimeter of the structure is T-shaped. Regarding some embodiments, the active areas are configured for finFET technology.

Another aspect of the present disclosure is directed to a method of generating layout, the layout being stored on a non-transitory computer-readable medium, the method comprising: generating active area patterns including: configuring the active area patterns as predetermined shapes; arranging the active area patterns relative to a grid having first and second tracks which are substantially parallel to corresponding orthogonal first and second directions; configuring the active area patterns into instances of a first row having a first conductivity and instances of a second row having a second conductivity; configuring each instance of the first row and of the second row to include a predetermined number of the first tracks; and defining a cell structure as having a place-and-route (PR) boundary which contains at least two contiguous rows including: at least one instance of the first row; and at least one instance of the second row; setting a width in the first direction of the at least one instance of the first row to be substantially different than the at least one instance of the second row. Regarding some embodiments, the at least one instance of the first row in the cell structure has a first width in the first direction; and the at least one instance of the second row in the cell structure has a second width in the first direction; the method further comprising: setting the second width to be substantially twice as large as the first width. Regarding some embodiments, the defining the cell structure includes: defining the cell structure such that the PR boundary contains an odd number of contiguous rows including: an even number of instances of the first row; and an odd number of instances of the second row. Regarding some embodiments, the defining the cell structure includes: locating the even number instances of the first row in the cell structure so as to be contiguous. Regarding some embodiments, the defining the cell structure includes: defining the cell structure such that the PR boundary contains an even number of contiguous rows including: at least one instance of the first row; and at least one instance of the second row. Regarding some embodiments, the defining the cell structure further includes: defining the cell structure such that the PR boundary contains an even number of contiguous rows including at least two instances of the first row and at least two instances of the second row, and configuring either the at least two instances of the first row or the at least two instances of the second row to be contiguous. Regarding some embodiments, the defining the cell structure includes: configuring a periphery of the cell structure to be L-shaped; or configuring a periphery of the cell structure to be T-shaped. Regarding some embodiments, the forming the active area patterns includes: configuring the active areas for finFET technology. Regarding some embodiments, the method further comprises: fabricating, based on the layout, at least one of (A) one or more semiconductor masks or (B) at least one component in a layer of an inchoate semiconductor integrated circuit.

Another aspect of the present disclosure is directed to a method of generating layout, the layout being stored on a non-transitory computer-readable medium, the method comprising: generating active areas having predetermined shapes; locating the active areas on a substrate; arranging the active areas relative to a grid having first and second tracks which are substantially parallel to corresponding orthogonal first and second directions; organizing the active areas into instances of a first row having a first conductivity and instances of a second row having a second conductivity; each instance of the first row and of the second row including a predetermined number of the first tracks; defining a first cell structure as having at least two contiguous rows including: at least one instance of the first row; and at least one instance of the second row; setting, for the first cell structure, a first width in the first direction of the at least one instance of the first row to be different than a second width of the at least one instance of the second row; and defining a second cell structure having an odd number of contiguous rows including: an even number of instances of the first row; and an odd number of instance of the second row; setting, for the second cell structure, a third width of the at least one instance of the first row to be substantially the same as a fourth width of the at least one instance of the second row such that the second cell structure has a uniform width; and at least one of: stacking the second cell structure on the first cell structure; or stacking the first cell structure on the second cell structure. Regarding some embodiments, the at least one instance of the first row in the first cell structure has a first width in the first direction; and the at least one instance of the second row in the first cell structure has a second width in the first direction, the second width being substantially twice as large as the first width. Regarding some embodiments, one of the following is true: the first cell structure includes: two instances of the first row; and one instance of the second row; or the first cell structure includes: two instances of the first row; and two instances of the second row.

Another aspect of the present disclosure is directed to a method of generating layout, the layout being stored on a non-transitory computer-readable medium, the method comprising: generating fin patterns including: arranging the fin patterns relative to a grid having first and second tracks which are substantially parallel to corresponding orthogonal first and second directions; configuring the fin patterns into instances of a first row having a first conductivity and instances of a second row having a second conductivity; configuring each instance of the first row to include a first predetermined number of fin patterns of the first conductivity type; and configuring each instance of the second row to include a second predetermined number of fin patterns of the second conductivity type; and generating gate patterns including: arranging the gate patterns substantially parallel to the second direction; arranging the gate patterns to overlap corresponding ones of the fin patterns; and defining a first cell structure as having a first place-and-route (PR) boundary which contains an odd number of contiguous rows including: an even number of instances of the first row; and an odd number of instance of the second row. Regarding some embodiments, the defining a first cell structure includes: locating the even number of instances of the first row in the first cell structure so as to be contiguous. Regarding some embodiments, the defining a first cell structure includes: setting a first width of each of the even number of instances of the first row to be the substantially the same as a second width of each of the odd number of instances of the second row. Regarding some embodiments, the method further comprises: fabricating, based on the layout, at least one of (A) one or more semiconductor masks or (B) at least one component in a layer of an inchoate semiconductor integrated circuit.

Another aspect of the present disclosure is directed to a semiconductor device comprising: active areas formed as predetermined shapes on a substrate and arranged relative to a grid having first and second tracks which are substantially parallel to corresponding orthogonal first and second directions; the active areas being organized into instances of a first row having a first conductivity and instances of a second row having a second conductivity; each instance of the first row and of the second row including a predetermined number of the first tracks; a first structure having at least two contiguous rows including: at least one instance of the first row; and at least one instance of the second row; the first structure being configured such that: each of the at least one instance of the first row in the first structure having a first width in the first direction; and each of the at least one instance of the second row in the first structure having a second width in the first direction, the second width being substantially different than the first width; and a second structure having an odd number of contiguous rows including: an even number of instances of the first row; and an odd number of instances of the second row; the second structure being configured such that each of the even number of instances of the first row and each of the odd number of instances of the second row has substantially the same width in the first direction; and wherein: the second structure is stacked on the first structure; or the first structure is stacked on the second structure. Regarding some embodiments, the at least one instance of the first row in the first structure has a first width in the first direction; and the at least one instance of the second row in the first structure has a second width in the first direction, the second width being substantially twice as large as the first width. Regarding some embodiments, one of the following is true: the first structure has three contiguous rows including: two instances of the first row; and one instance of the second row; or the first structure has four contiguous rows including: two instances of the first row; and two instances of the second row.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A semiconductor device comprising:
    fins formed on a substrate and arranged substantially parallel to a first direction;
        the fins being organized into instances of a first row and instances of a second row, the first and second rows extending in the first direction;
        each instance of the first row including a first predetermined number of fins having a first conductivity type; and
        each instance of the second row including a second predetermined number of fins having a second conductivity type;
    gate structures formed over corresponding ones of the fins and arranged substantially parallel to a second direction, the second direction being substantially perpendicular to the first direction; and
    a first structure having an odd number of contiguous rows including:
        an even number of instances of the first row; and
        an odd number of instances of the second row.

2. The semiconductor device of claim 1, wherein:
    each of the even number of instances of the first row in the first structure has a first width in the first direction; and
    each of the odd number of instances of the second row in the first structure has a second width in the first direction, the second width being substantially different than the first width.

3. The semiconductor device of claim 1, wherein:
    a size in the first direction of each row is substantially the same.

4. A semiconductor device comprising:
    active areas formed as predetermined shapes on a substrate and arranged relative to a grid having first and second tracks which are substantially parallel to corresponding orthogonal first and second directions, the active areas comprising fingers, wherein each finger defines a long axis that extends in the first direction;
        the active areas being organized into instances of a first row having a first conductivity and instances of a second row having a second conductivity, the first and second rows extending in the first direction;
        each instance of the first row and of the second row including a corresponding first and second number predetermined number of the first tracks; and
    a structure having at least two contiguous rows including:
        at least one instance of the first row; and
        at least one instance of the second row;
    wherein:
        each of the at least one instance of the first row in the structure has one or more of the fingers, each of the one or more of the fingers in the first row having a first width in the first direction; and
        each of the at least one instance of the second row in the structure has one or more of the fingers, each of the one or more of the fingers in the second row having a second width in the first direction, the second width being substantially different than the first width.

5. The semiconductor device of claim 4, wherein:
    the structure has two contiguous rows.

6. The semiconductor device of claim 4, wherein:
    the second width is substantially twice the first width.

7. The semiconductor device of claim 4, wherein one of the following is true:
    the structure has an odd number of contiguous rows including:
        an even number of instances of the first row; and
        an odd number of instances of the second row; or
    the structure has an even number of contiguous rows including:
        at least one instance of the first row; and
        at least one instance of the second row.

8. The semiconductor device of claim 7, wherein one of the following is true:
    in the structure which has the odd number of contiguous rows, at least two of the even number of one or more instances of the first row are contiguous; or
    the structure which has the even number of contiguous rows includes:
        at least two instances of the first row; and
        at least two instances of the second row; and
    wherein, in the structure which has the even number of contiguous rows, two or more of the at least two instances of the first row are contiguous.

9. The semiconductor device of claim 4, wherein:
    a perimeter of the structure is L-shaped.

10. The semiconductor device of claim 4, wherein:
    a perimeter of the structure is T-shaped.

11. The semiconductor device of claim 4, wherein:
    the active areas are configured for finFET technology.

12. A method of generating layout, the layout being stored on a non-transitory computer-readable medium, the method comprising:
    generating active area patterns including:
        configuring the active area patterns as predetermined shapes;
        arranging the active area patterns relative to a grid having first and second tracks which are substantially parallel to corresponding orthogonal first and second directions;
        configuring the active area patterns into instances of a first row having a first conductivity and instances of a second row having a second conductivity, the first and second rows extending in the first direction, the active area patterns comprising finger patterns, wherein each finger pattern defines a long axis that extends in the first direction; and configuring each instance of the first row and of the second row to include a predetermined number of the first tracks; and defining a cell structure as having a place-and-route (PR) boundary which contains at least two contiguous rows including:

at least one instance of the first row having one or more of the finger patterns, each of the one or more of the finger patterns in the first row having a first width in the first direction; and at least one instance of the second row having one or more of the finger patterns, each of the one or more of the finger patterns in the second row having a second width in the first direction;

setting the first width to be substantially different than the second width.

13. The method of claim 12, wherein:

the at least one instance of the first row in the cell structure has a first width in the first direction; and the at least one instance of the second row in the cell structure has a second width in the first direction;

the method further comprising:

setting the second width to be substantially twice as large as the first width.

14. The method of claim 12, wherein the defining the cell structure includes:

defining the cell structure such that the PR boundary contains an odd number of contiguous rows including:

an even number of instances of the first row; and an odd number of instances of the second row.

15. The method of claim 14, wherein the defining the cell structure includes:

locating the even number of instances of the first row in the cell structure so as to be contiguous.

16. The method of claim 12, wherein the defining the cell structure includes:

defining the cell structure such that the PR boundary contains an even number of contiguous rows including:

at least one instance of the first row; and at least one instance of the second row.

17. The method of claim 16, wherein the defining the cell structure further includes:

defining the cell structure such that the PR boundary contains the even number of contiguous rows including:

at least two instances of the first row; and at least two instances of the second row; and configuring either the at least two instances of the first row or the at least two instances of the second row to be contiguous.

18. The method of claim 12, wherein the defining the cell structure includes:

configuring a periphery of the cell structure to be L-shaped; or configuring the periphery of the cell structure to be T-shaped.

19. The method of claim 12, wherein:

the generating the active area patterns includes:

configuring the active area patterns for finFET technology.

20. The method of claim 12, further comprising:

fabricating, based on the layout, at least one of (A) one or more semiconductor masks or (B) at least one component in a layer of an inchoate semiconductor integrated circuit.

* * * * *